United States Patent [19]

Fulks et al.

[11] 4,168,796
[45] Sep. 25, 1979

[54] TESTER WITH DRIVER/SENSOR CIRCUIT HAVING PROGRAMMABLE TERMINATION DEVICES

[75] Inventors: Robert G. Fulks; Robert E. Anderson, both of Phoenix, Ariz.

[73] Assignee: NCR Corporation, Dayton, Ohio

[21] Appl. No.: 895,899

[22] Filed: Apr. 13, 1978

[51] Int. Cl.² .................. G06F 11/00; G01R 31/00
[52] U.S. Cl. ............................... 235/302; 324/73 R
[58] Field of Search ................ 235/302, 304, 304.1; 324/73 R, 73 AT

[56] References Cited

U.S. PATENT DOCUMENTS

| | | | |
|---|---|---|---|
| 3,492,572 | 1/1970 | Jones et al. | 324/73 |
| 3,739,349 | 6/1973 | Burdette, Jr. et al. | 324/73 |
| 3,922,537 | 11/1975 | Jackson | 235/302 |
| 3,924,109 | 12/1975 | Jhu et al. | 235/302 |
| 3,976,864 | 8/1976 | Gordon et al. | 235/302 |
| 3,976,940 | 8/1976 | Chau et al. | 324/73 R |
| 4,000,460 | 12/1976 | Kadakia et al. | 324/73 R |
| 4,012,625 | 3/1977 | Bowen et al. | 235/302 |

*Primary Examiner*—Jerry Smith
*Attorney, Agent, or Firm*—J. T. Cavender; Albert L. Sessler, Jr.

[57] ABSTRACT

Portable tester and method for testing a variety of printed circuit boards without utilizing specialized adaptor boards for rerouting input test signals and supply voltages from the tester to various pins of the board under test. A plurality of edge connectors have their respective pins connected to corresponding edge connector stake pins. Each edge connector stake pin is connected to or isolated from the corresponding driver/sensor stake pin by means of a switch. Each driver/sensor stake pin is connected to the input/output terminal of a programmable driver/sensor circuit. A main processor is utilized to store a test program and to transmit data and control information to predetermined driver/sensor circuits. A high speed processor coupled between the main processor and the inputs of the driver/sensor circuits includes a parallel-loadable shift register, an instruction register, an instruction decoder and control circuitry connected to the inputs of the driver/sensor circuitry. The high speed processor memory can store a bus-defining subroutine containing a sequence of data shifting instructions which shift a word in the shift register to the input of driver/sensor circuits specified by the arguments of the shifting instruction at high speed, thereby achieving high speed routing of data from the main processor to the board under test with very few instructions of the test program. Each driver/sensor circuit has programmable pull-up and pull-down termination devices which obviate the need for certain termination resistors on the board under test.

6 Claims, 20 Drawing Figures

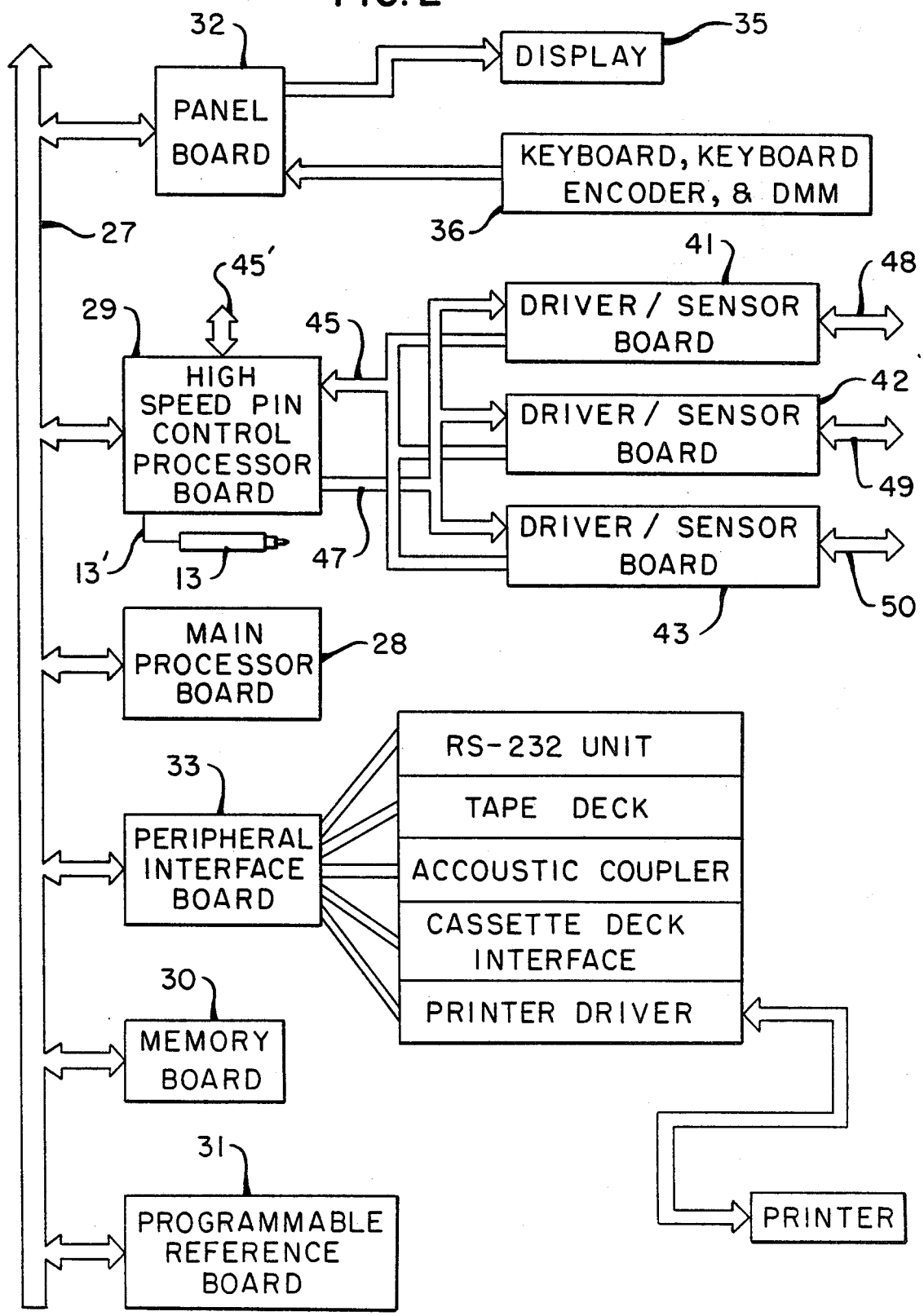

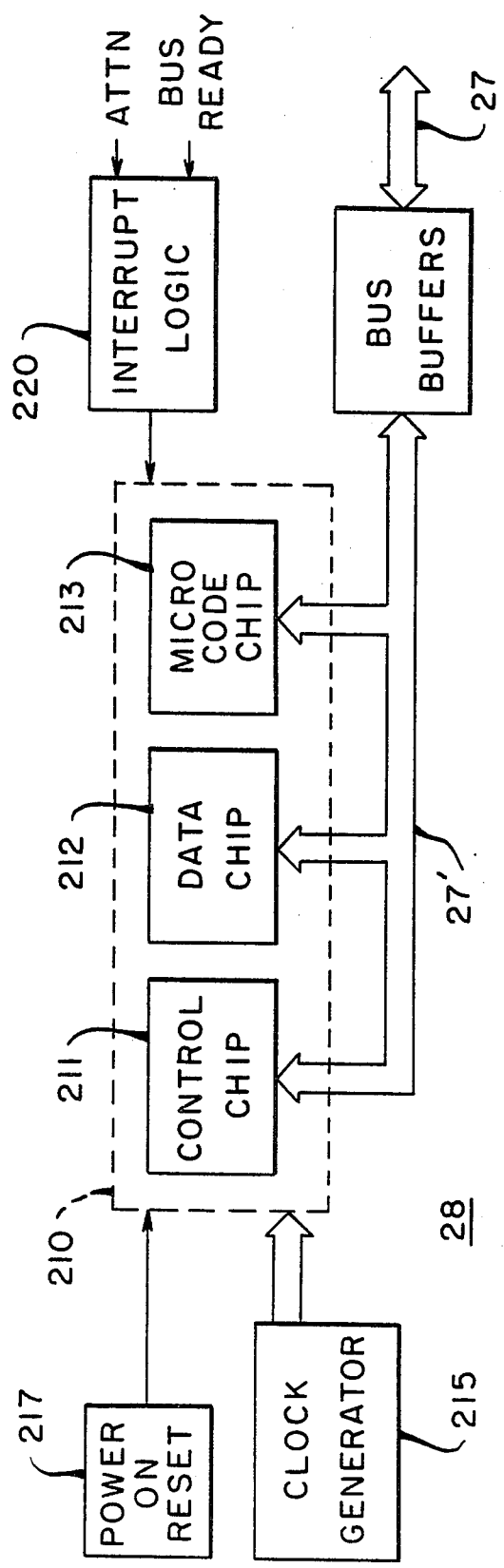
FIG. 4
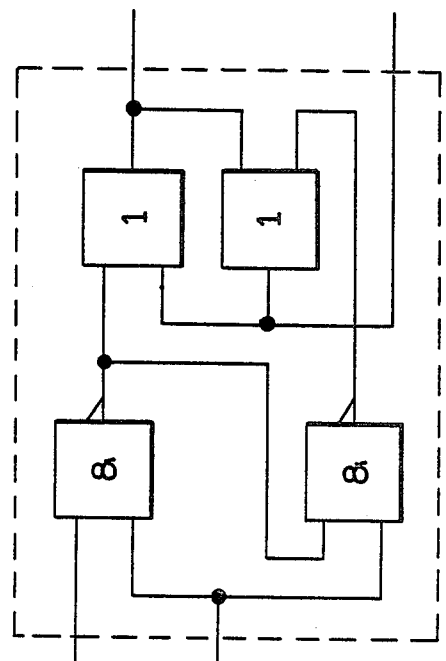
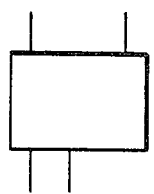
FIG. 3D

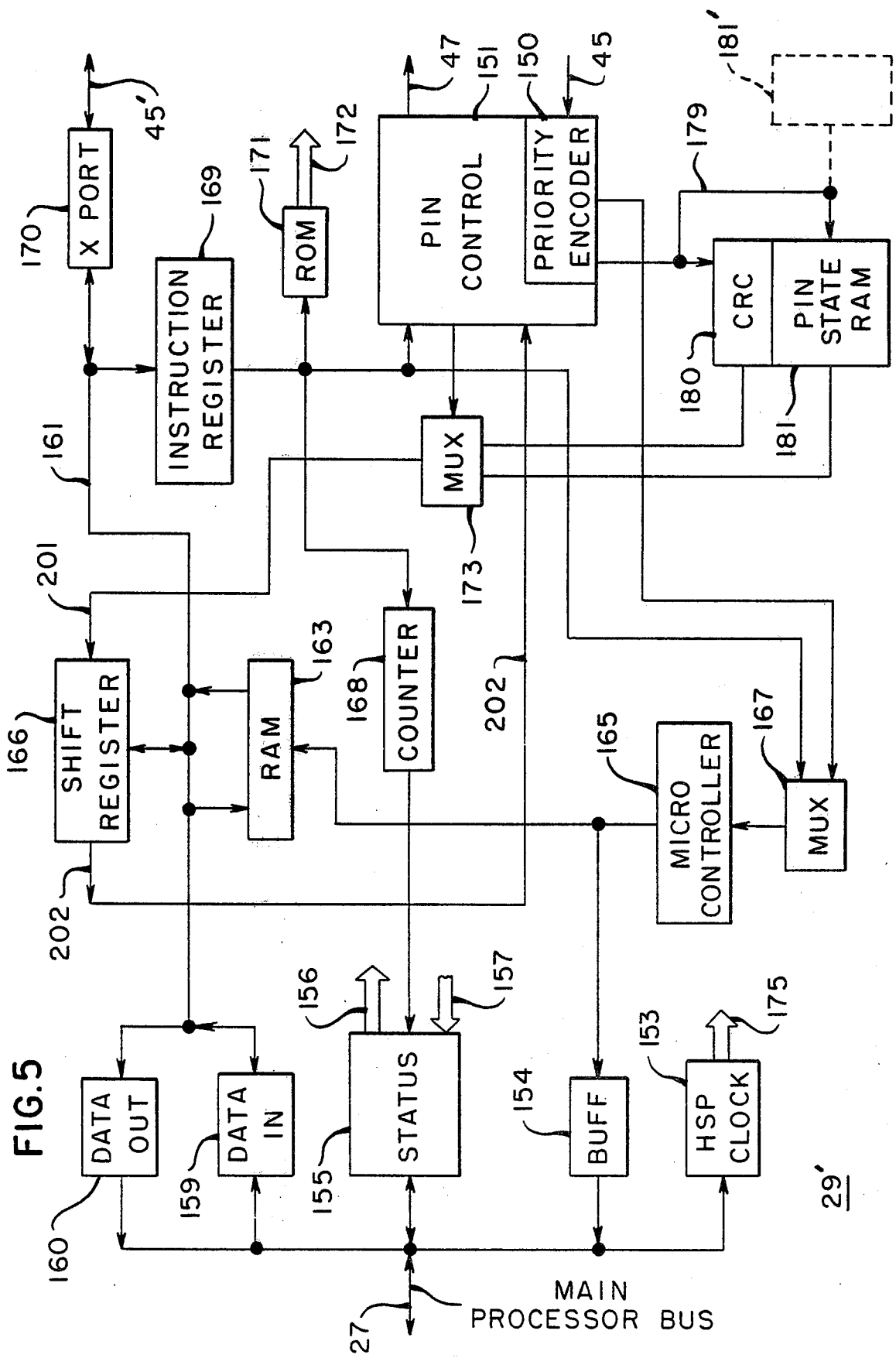

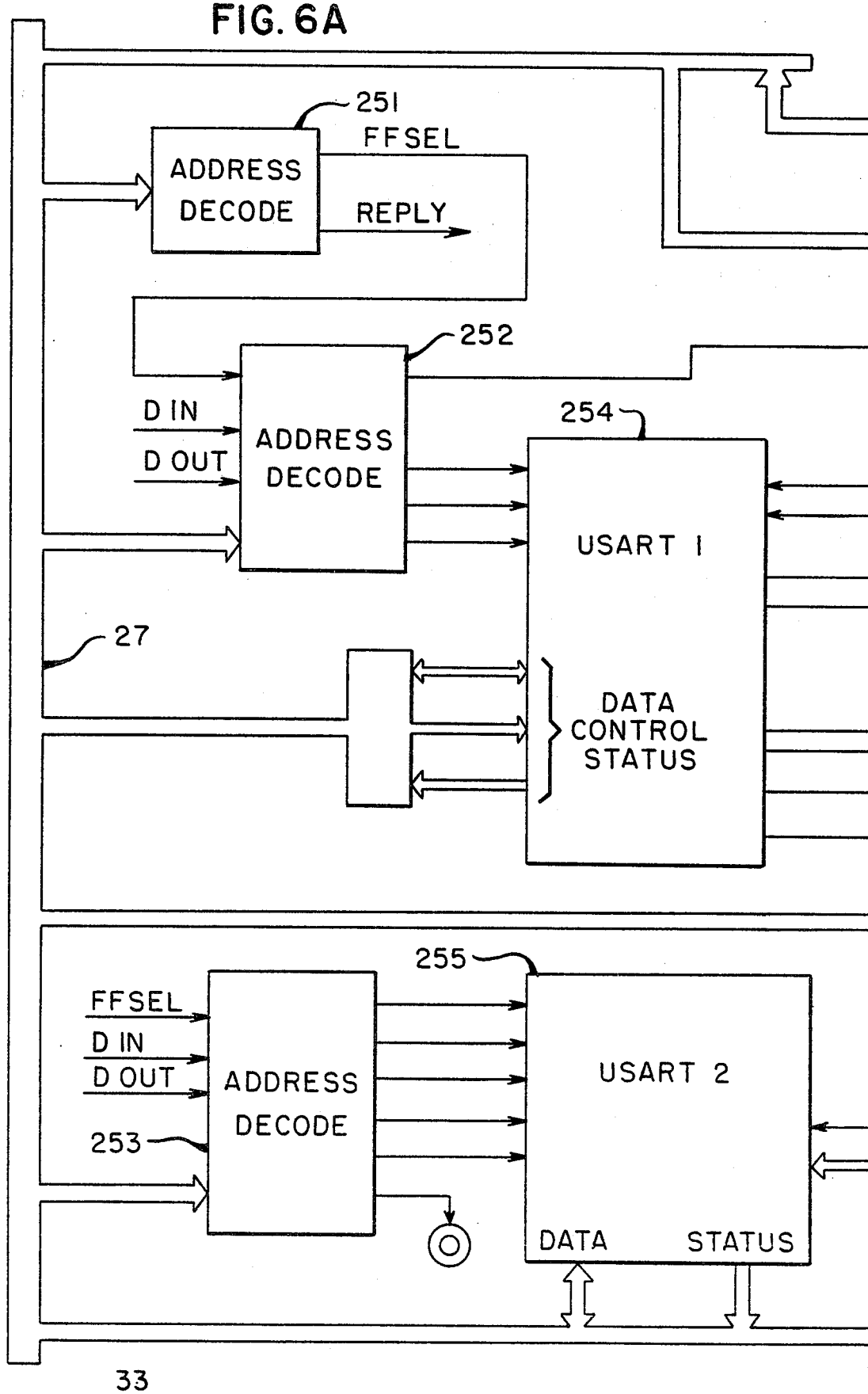

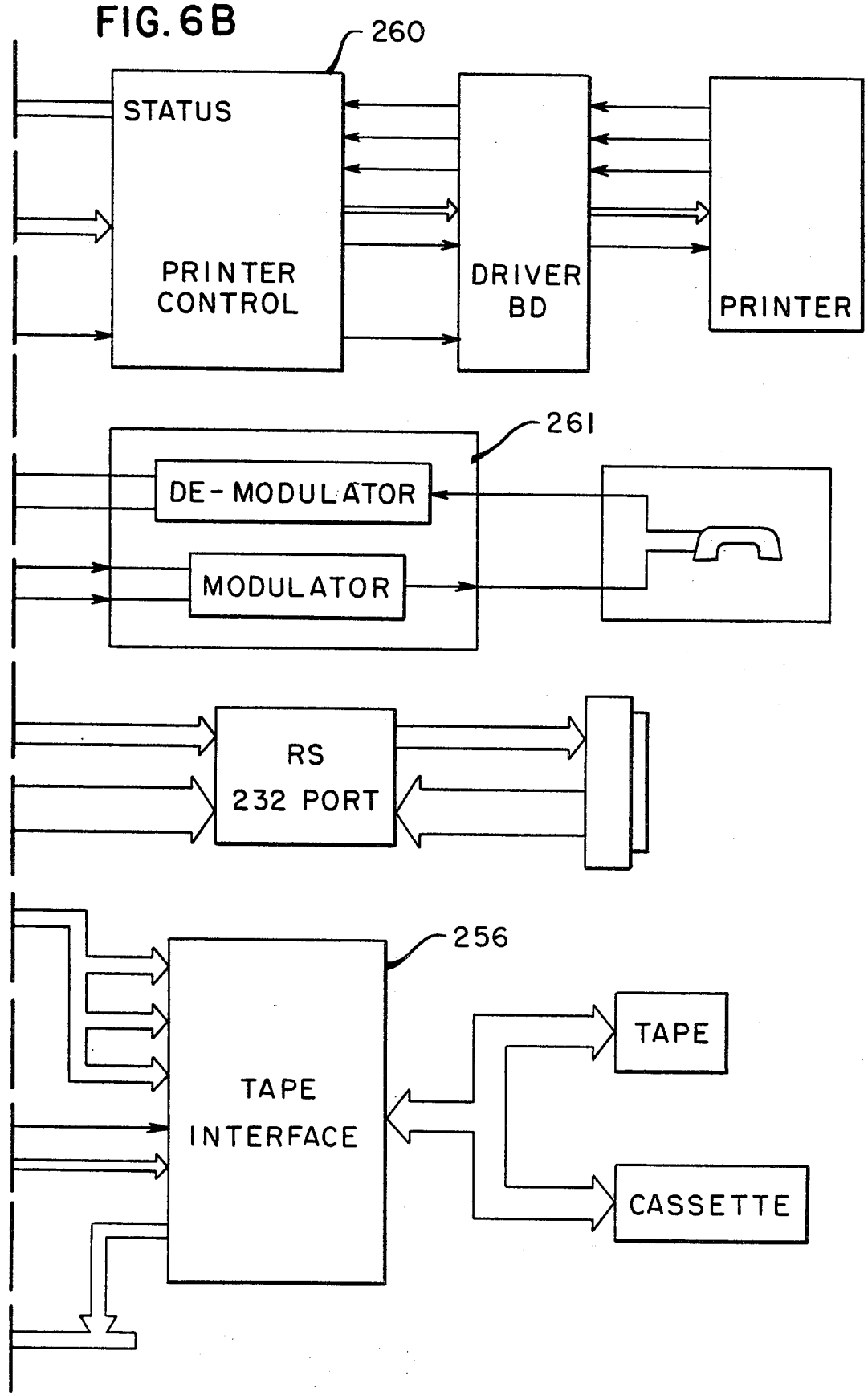

FIG. 7B
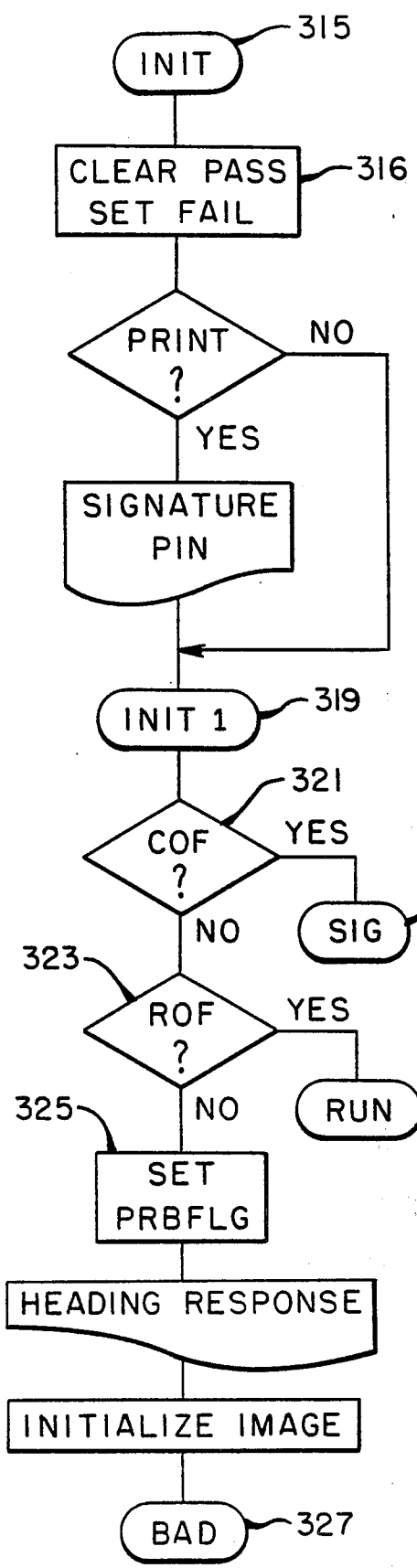
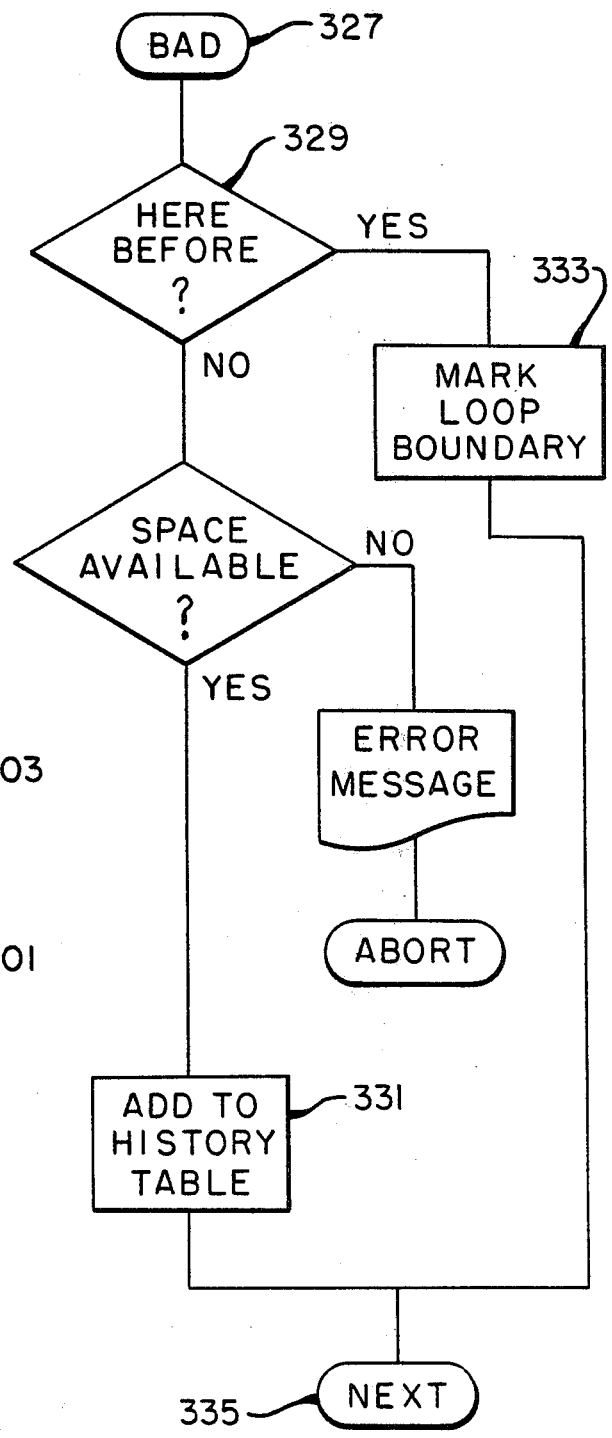

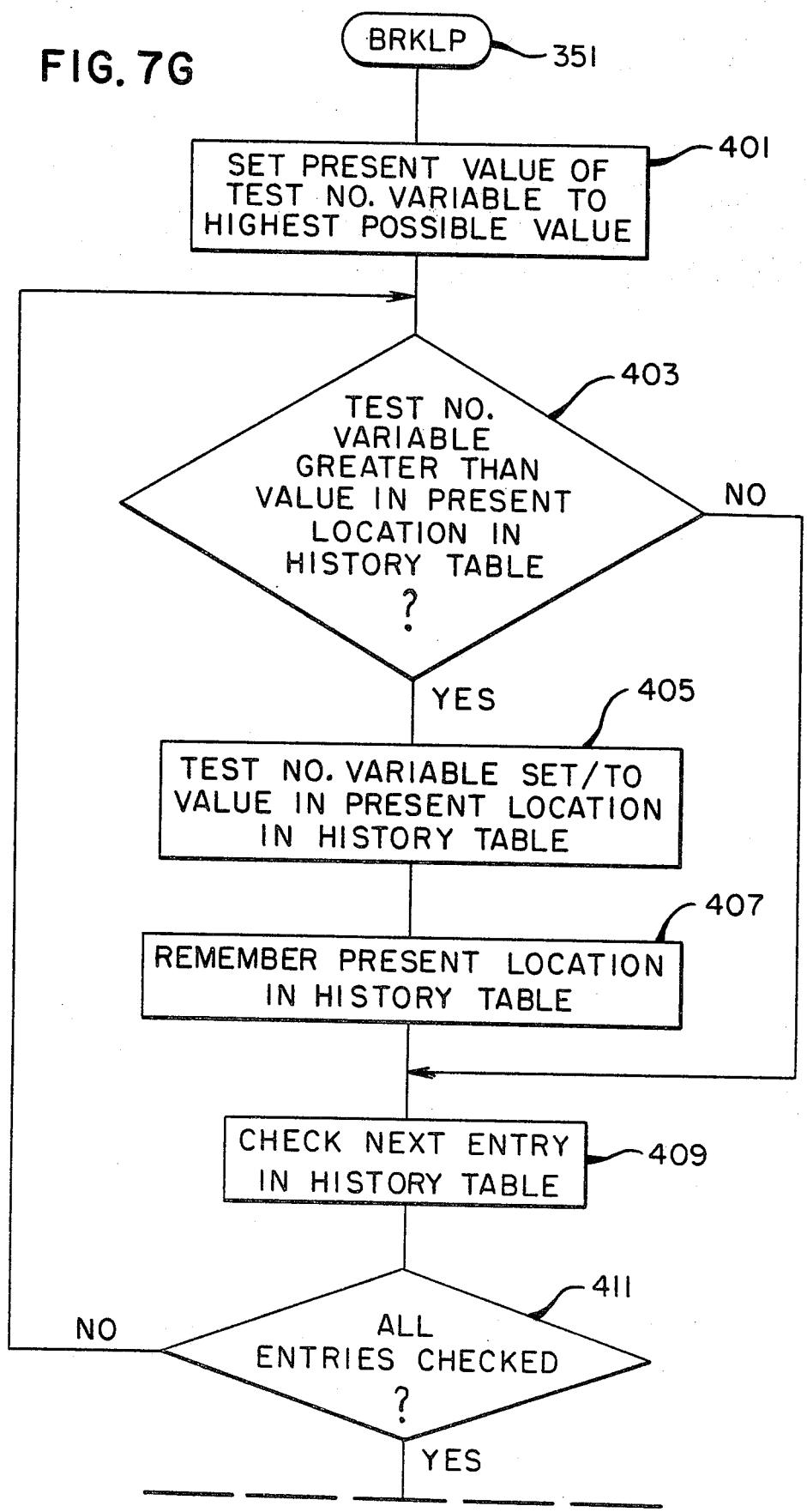

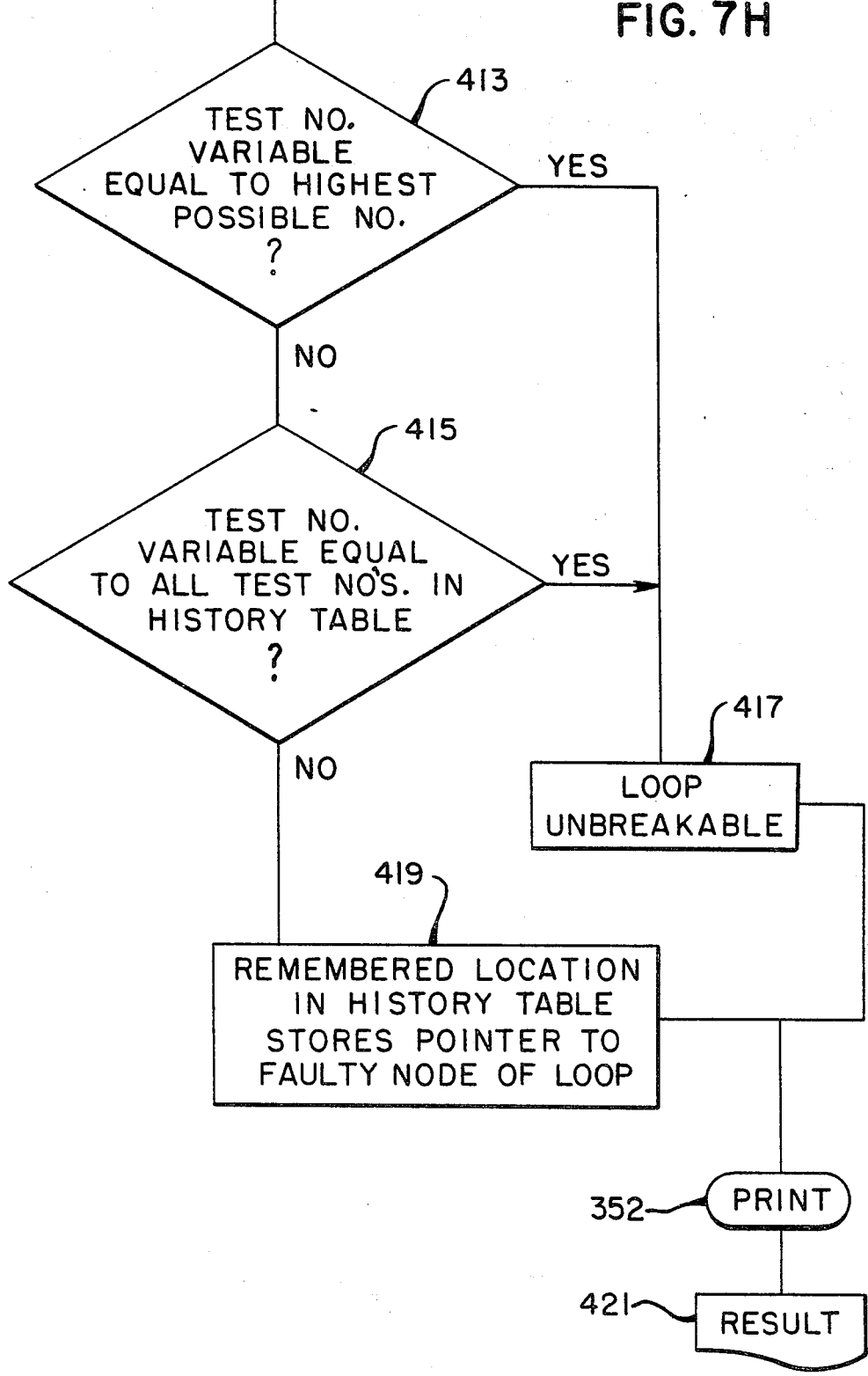

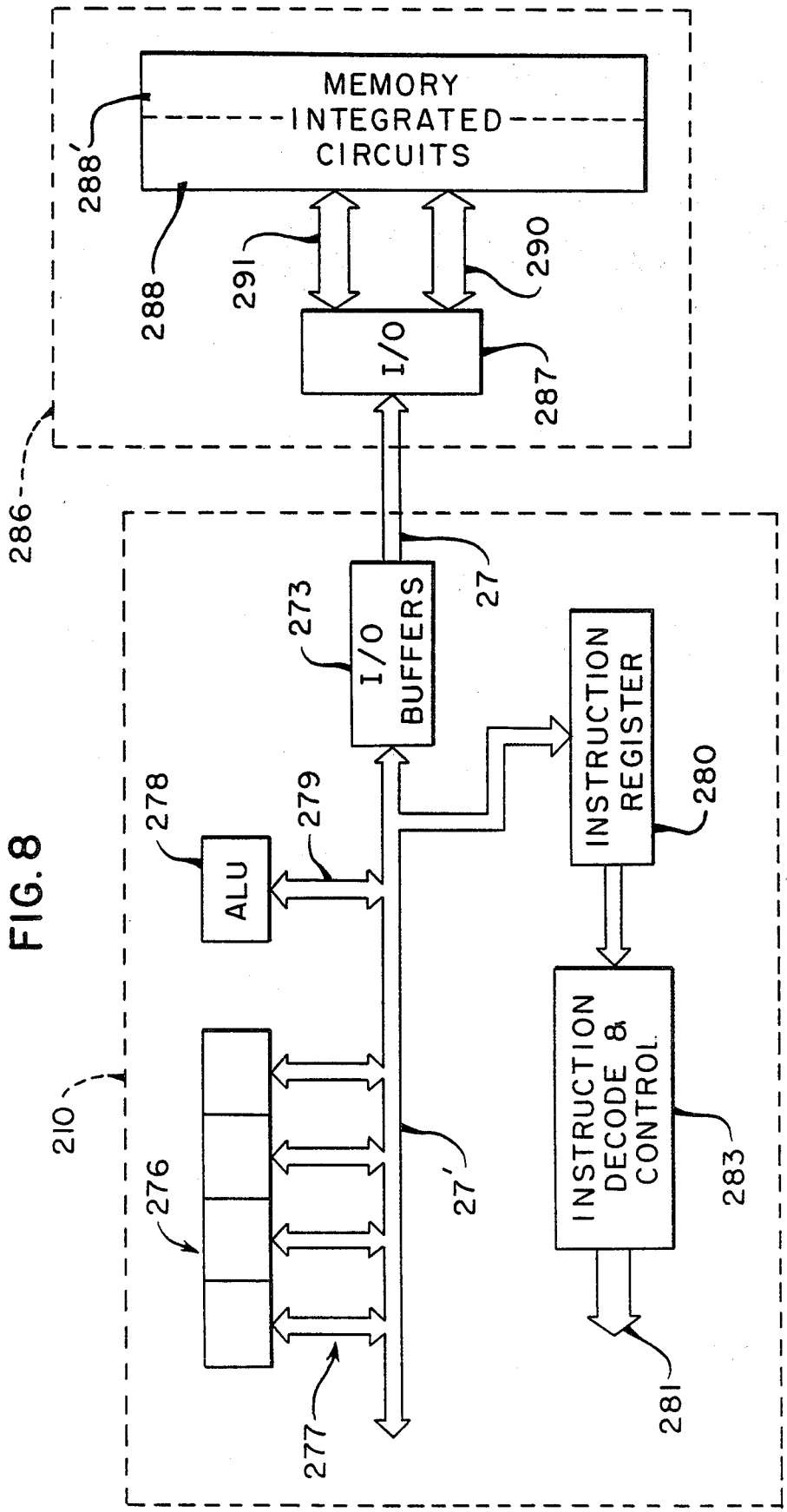

TESTER WITH DRIVER/SENSOR CIRCUIT HAVING PROGRAMMABLE TERMINATION DEVICES

BACKGROUND OF THE INVENTION

The invention relates to testers and methods for testing digital circuits, and more particularly to portable computer-based testers and methods for testing digital printed circuit boards.

Modern complex digital electronic equipment is ordinarily fabricated utilizing printed circuit boards which include a large number of digital integrated circuits and other components mounted thereon. Manufacturers of such complex electronic equipment are frequently obligated to service installed units. Such servicing involves testing the electronic equipment to isolate and repair (or replace) faulty components. Consequently, it is necessary to test printed circuit boards at the site of the electronic equipment. Such "on site" testing is referred to as "field service testing", in contrast to "factory testing", the latter testing being performed by the manufacturer on printed circuit boards which must be returned to the factory for testing and repair because the field testers presently available are incapable of isolating faulty components at the site of the installed electronic equipment, and because the field service testing personnel, who ordinarily are not extensively trained in details of repairing logic circuitry of the variety of different types of printed circuit boards which may have to be tested, are incapable of making "on the spot" repairs or component replacements.

Certain of the above-described "factory testers" are capable of testing each node in the printed circuit board under test and identifying faults by comparison of each node response to a known correct response for that node. Such factory testers require that the complete data stream be stored for every node of both the printed circuit board under test and an identical "known good" board. The "factory testers" which have the above capability require large memories. In order to reduce the need for complex interface adaptor boards to "interface" between the above factory testers and various families of printed circuit boards to be tested, factory testers have utilized programmable driver/sensor circuits electrically connected to every pin of the board under test and have utilized expensive multiplexing circuitry to route data from the main processor to predetermined ones of the driver/sensor circuits in order to achieve suitably high rates of transferring input test data from the main processor to the board under test. However, such multiplexing circuitry is very expensive. In order to provide the clock signals required by many digital printed circuit boards, factory testers have utilized large serial random access memories connected in series with inputs of each of the programmable driver/sensor circuits. The data stream inputted into each input of the printed circuit board under test is initially stored in a respective one of the high speed serial random access memories. The respective data streams are then outputted as a burst of logical ones and zeros from each of the serial memories. However, the cost of providing such serial memories for this purpose is very high.

Unfortunately, because of the complexity of prior "factory testers" which have the capability of testing and isolating faults in complex digital printed circuit boards, the techniques utilized in the prior "factory testers" are unsuited for implementation in lightweight, low cost portable computer-based testers for "on site" testing of printed circuit boards of installed digital electronic equipment.

In spite of the high cost and complexity of such factory testers, in order to route power supply voltages to the appropriate power supply pins of various families of printed circuit boards, it has been necessary to use adaptor boards or relays to route programmable power supplies of the factory tester to the appropriate pins of the printed circuit board under test.

Because of the above factors, presently available factory testers cost in the range from approximately $50,000 to approximately $250,000. This cost range greatly exceeds the permissable range for a portable service tester. Unfortunately, the very high cost and large physical size of factory testers is mainly due to the inclusion therein of the features which give available factory testers their vastly improved testing and fault isolation capability over presently available portable field service testers, namely the very large memory storage requirements for storing incoming data and known correct responses for boards under test, the complex multiplexing and control circuitry associated with every input/output pin of the test, and large serial random access memories associated with each input/output pin of the tester to provide high speed inputting of data to each pin of the board under test.

Up to now, presently available portable field service testers are incapable of automatic guided probe fault isolation and are incapable of isolating faults in digital loops. Specialized adaptor boards are required to accomplish re-routing of test signals and power supply signals to the proper pins of the board under test. Further, presently available portable field service testers are incapable of generating high speed clock signals necessary to test many digital printed circuit boards, necessitating provision of clock generating circuitry on the above-mentioned adaptor boards. Further, the known portable testers (and most factory testers) have been incapable of suitably testing asynchronously operating printed circuit boards, such as microprocessor-based printed circuit boards having free running clock generating circuits. It has generally been necessary to unplug the microprocessor and/or clock generating circuitry and then attempt to test the remainder of the printed circuit board by stimulating it with signals produced by the tester.

Consequently, presently available portable field service testers must be accompanied by a variety of specialized adaptor boards to permit testing of the variety of printed circuit boards likely to be encountered in various types of electronic equipment. Due to the inability of present portable field service testers to isolate faults in digital printed circuit boards under test, it is necessary to maintain a large stock of "spare" boards which are utilized to temporarily replace printed circuit boards found to be defective in the electronic equipment, and to ship the defective boards back to the factory for thorough testing using a factory tester. The defects, once isolated at the factory, are then repaired, shipped back to the site of the installed electronic equipment and "plugged in", and the temporary "spare" board is returned to the inventory of "spares". The high overhead costs and inconvenience associated with maintaining an inventory of "spare" printed circuit boards as well as a variety of adaptor boards presently adds greatly to the inconvenience and cost of field service testing.

A number of U.S. patents have been found which are believed relevant. U.S. Pat. No. 3,739,349 discloses a programmable driver/sensor circuit. U.S. Pat. No. 3,922,537 discloses an automatic tester having programmable multiplexing apparatus to electrically connect different measurement and stimulus devices to each pin of the board under test. The latter approach is used by most factory testers, and is too bulky and too expensive for utilization in portable field service testers.

The forefront of the art in the area of portable service processors is believed to be generally indicated by U.S. Pat. Nos. 3,976,864 and 3,924,181 and is also believed to be indicated by the following articles: "Signature Analysis: A New Digital Field Service Method", by Robert A. Frohwerk, pgs. 2–8 Hewlett-Packard Journal, May, 1977; "Easy-to-Use Signature Analyzer Accurately Trouble-Shoots Complex Logic Circuits" by Anthony Y. Chan, pgs. 9–14, Ibid., and "Signature Analysis-Concepts, Examples and Guide Lines" by Hanns J. Nadig, pgs. 15–21, Ibid.

Other references found in a search pertaining to the present disclosure include the following U.S. Pat. Nos.: 3,274,529; 3,325,766; 3,336,434; 3,409,828; 3,549,996; 3,646,438; 3,657,527; 3,676,777; 3,739,349; and 3,922,537.

There is clearly a great need at the present time for a low cost portable field tester capable of permitting ordinary service personnel to quickly "field test" individual printed circuit boards in installed electronic equipment and isolate faults at the component level so that faulty components may be quickly identified and replaced at the installation site of the electronic equipment. It is necessary that such a low cost portable field tester have testing and fault isolation power approaching that of factory testers, which are presently much larger and more expensive than is acceptable for a portable field service tester.

SUMMARY OF THE INVENTION

Accordingly, it is an objective of the invention to provide an economical tester and method for testing a variety of printed circuit boards without utilization of complex adaptor apparatus to effect routing of signals and voltages from the tester and a printed circuit board to be tested.

It is another object of the invention to provide a processor-based tester and method for reducing the programming burden of testing printed circuit boards.

It is another object of the invention to provide a portable testing apparatus and method which requires a minimum number of program steps in the test program in order to effect high speed transfer of a data word from the testing apparatus to a predetermined group of pins of a device to be tested.

It is another object of the invention to provide method and testing apparatus for rapidly and economically transferring a data word to a predefined group of pins of a device to be tested.

It is another object of the invention to rapidly transfer data from a portable tester to a predefined group of inputs of a device to be tested utilizing a minimum amount of circuitry in the tester.

It is another object of the invention to rapidly transfer a data word from a main processor of a tester to a predefined group of pins of a device to be tested without requiring a large amount of multiplexing circuitry and/or memory circuitry corresponding to each input/output pin of the tester.

It is another object of the invention to provide a testing system and method which easily permits re-routing of signals and voltages produced by the testing system to various pins of a device to be tested.

It is another object of the invention to provide a testing system and method which permits convenient routing of signals from the testing system to a printed circuit board to be tested having connectors on different edges thereof.

It is another object of the invention to provide a convenient system and method for increasing the rate of data transfer of a data word from a low speed processor to a predetermined group of remote conductors.

It is another object of the invention to provide a driver/sensor circuit for use in a testing system which avoids the requirement of providing resistive termination devices on printed circuit boards tested by the tester.

It is another object of the invention to provide a portable tester with an information entry system which simplifies entry of commands and reduces the likelyhood of producing errors into entry of information.

Another object of the invention is to provide a tester and method for economically testing an asynchronously operating printed circuit board or digital circuit.

Briefly described, and in accordance with one embodiment thereof, the invention includes a tester having a plurality of driver/sensor circuits each having programmable termination devices. The tester includes a processor and a bus connected to the processor. Each of the programmable driver/sensor circuits has a data input terminal and a terminal selectively programmable either as in input terminal or an output terminal. Such terminals are coupled to the various terminals of a printed circuit board to be tested. In one embodiment of the invention, each of the driver/sensor circuits includes a first termination device in the form of a current source programmable for producing a pull-up current flowing into the programmable terminal of that driver/sensor circuit. Each driver/sensor circuit also includes a second termination device in the form of a current source programmable to produce a pull-down current flowing out of the programmable terminal of that driver/sensor circuit. Pull-up and/or pull-down termination resistors may thereby be omitted from printed circuit boards to be tested by the tester.

BRIEF DESCRIPTION OF THE DRAWINGS

FIG. 2 is a block diagram of the processor system and processor bus, including the electronics required to interface between the board under test and the processor bus.

FIG. 3D is a logic circuit for implementing the latches of FIG. 3B.

FIG. 4 is a more detailed block diagram of the processor board of FIG. 2.

FIG. 5 is a more detailed block diagram of the high speed processor board of FIG. 2.

FIG. 6A is a detailed block diagram of part of the peripheral interface board of FIG. 2.

FIG. 6B is a detailed block diagram of the remainder of the peripheral interface board of FIG. 2.

FIG. 7A–7H, in combination, constitute a flow diagram of the fault isolation and loop-breaking algorithm which is utilized in conjunction with the tester and method of the invention.

FIG. 8 is a diagram illustrating the basic functional components of the microprocessor chip system 210 of FIG. 4 in conjunction with a memory system.

DESCRIPTION OF THE INVENTION

The digital tester of the invention, hereinafter referred to as the "PSP" (portable service processor), is a processor-oriented portable tester especially suited to testing printed circuit boards. It is digital logic circuit tester that can detect and isolate faults on digital printed circuit boards. Because of its portable design and its automatic fault isolation features, it is particularly suited for numerous field engineering applications. Since the PSP is in essence a general purpose microprocessor based data processing system, it also has a number of other service applications, explained subsequently.

The digital tester of this invention is further described in the copending patent applications entitled "METHOD AND PORTABLE APPARATUS FOR TESTING PRINTED CIRCUIT BOARDS", Ser. No. 895,898, invented by Donald E. Phelps; "METHOD AND APPARATUS FOR TRANSMITTING DATA TO A PREDEFINED DESTINATION BUS", Ser. No. 895,891, invented by Robert G. Fulks, Robert E. Enfield, and Edward H. Greenwood; and "METHOD AND APPARATUS FOR ISOLATING FAULTS IN A LOGIC CIRCUIT", Ser. No. 895,892, invented by Robert G. Fulks and Robert E. Enfield and Eric Sacher, all assigned to the present assignee, filed on even date herewith, and incorporated by reference herein.

Figure 1A:
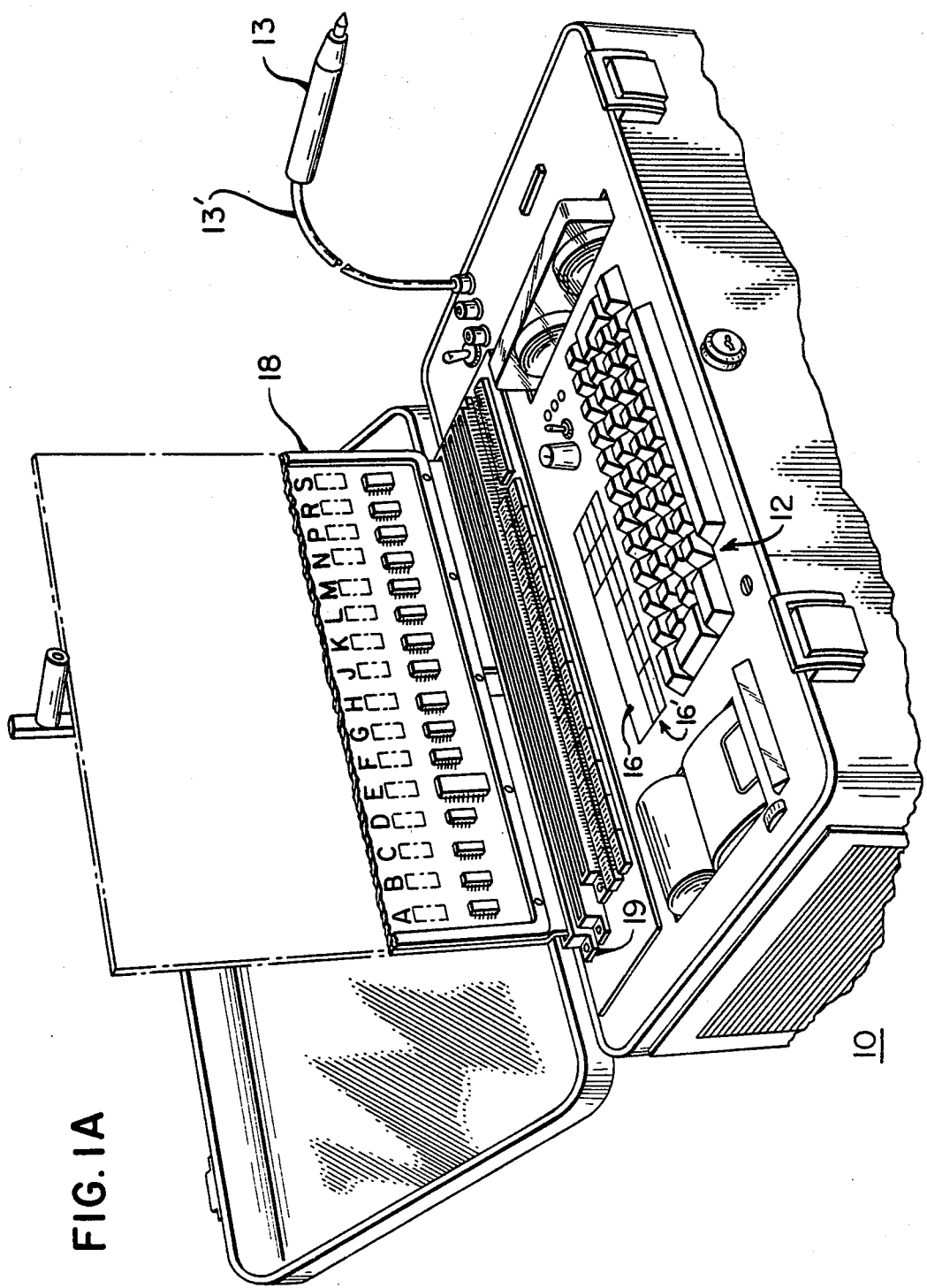
FIG. 1A is a perspective drawing of the portable digital tester and a board under test.

The complete PSP unit 10 is shown in FIG. 1A. A printed circuit board 18 being tested by PSP is connected into edge connector 19 (printed circuit boards under test are referred to hereinafter as "boards under test".) It should be noted that various devices in board 18 are labeled by letters; such labeling permits the PSP to instruct the operator as to which nodes to probe during the fault isolation procedure, subsequently described in detail. Keyboard 12 permits the operator to enter data and commands into the PSP.

Figure 1B:
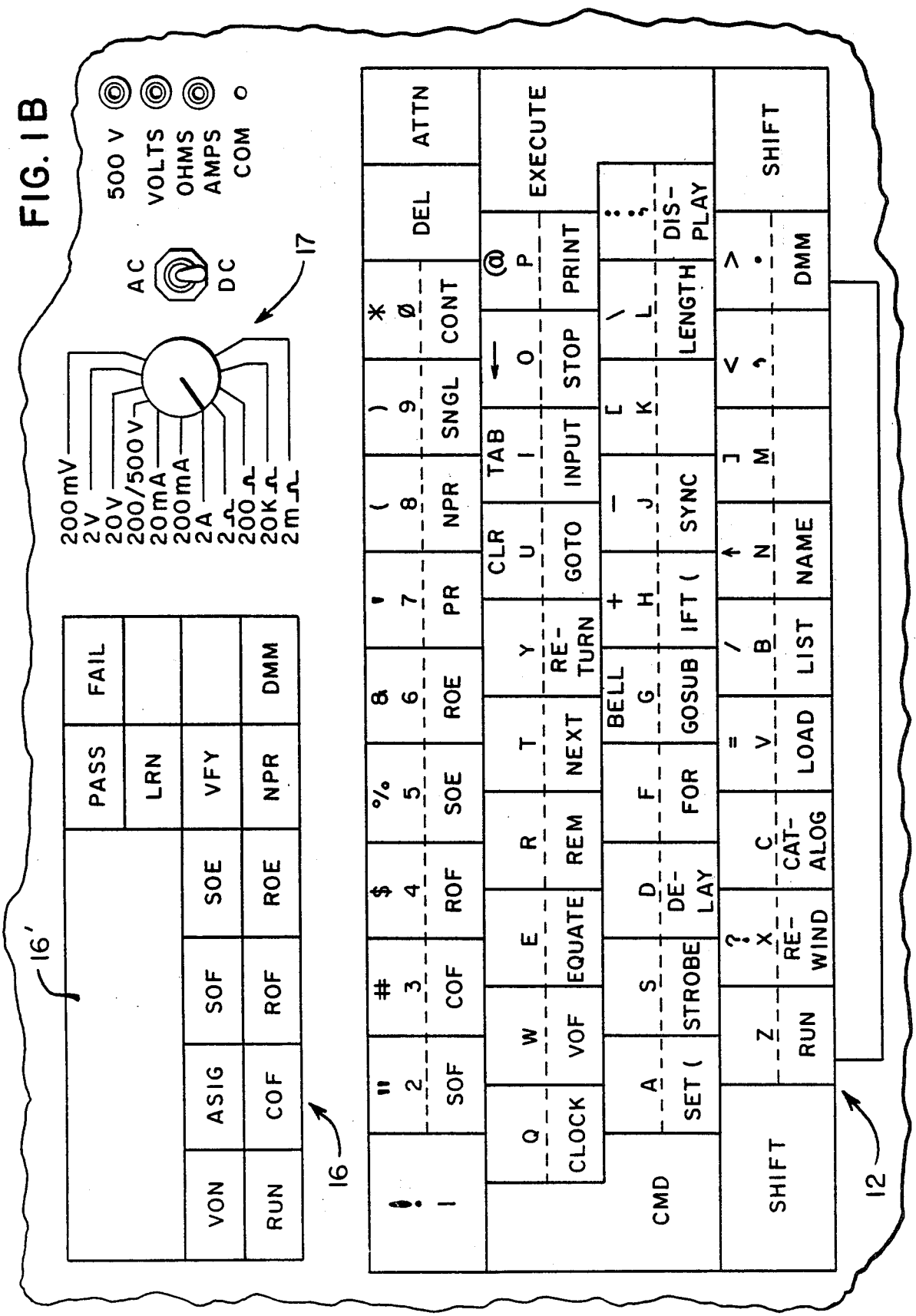
FIG. 1B is a drawing of the keyboard, display, and digital multi-meter of the digital tester of FIG. 1A.

The keyboard and display are shown in detail in FIG. 1B, wherein it is seen that a number of the keys have shifted and unshifted characters thereon, and also have thereon single word commands, such as RUN, CATALOG, etc. The "upper" or "shifted" characters are entered by using the shift key; the command words are entered by using the CMD (command) key.

The operating panel of PSP 10 also includes a display unit 16 which includes display section 16' which displays out alphanumeric characters which indicate such information as the status of the PSP, instructions to the operator, or information momentarily entered by the operator. Digital multimeter 17 is also provided on the operator's panel for purposes subsequently set forth.

Probe 13 is utilized by the operator to probe various nodes of board under test 18 in response to instructions displayed on display unit 16, according to the guided probing system and method subsequently described in more detail.

The PSP is controlled from the keyboard of FIG. 1B. Keyboard 12 has three levels of characters so that it can function both as a standard keyboard for typed statements and as a flexible control panel with single-key entry of commands. The normal keyboard corresponds to the lower-shift portions of the keys containing letters, numbers, and some punctuation marks, including period, comma, and semicolon. The alphanumeric characters are all upper-case.

The SHIFT key is utilized in the conventional manner to enter the characters and symbols of the "upper-shift" portions of the keys, including the remaining punctuation marks and some control functions. In operation, the SHIFT key is held down and the desired key is depressed in order to enter an "upper-shift" character.

The command (CMD) key is utilized to enter statement keywords which may be utilized as system commands or utilized in program statements. This permits entry of system commands in a single operation and thereby eliminates typing errors. The CMD key is held down and the key with the desired keyword written in the lower portion of the key is depressed. Each keyword may also be entered by typing the complete keyword, such as REWIND, without use of the CMD key.

A "space" can be provided by depressing the space bar at the bottom of the keyboard, but whenever a keyword is entered utilizing the CMD key, a space after that keyword is automatically provided.

Keyboard 12 includes three special operating keys, including the "attention" (ATTN) key, the EXECUTE key, and a "delete" (DEL) key. The operator can interrupt PSP 10 at any time by depressing the ATTN key. This interrupts PSP 10 and places it in a READY state, awaiting a new command. The EXECUTE key is depressed to execute a line entered on the keyboards; if the line contains a "line number" at the beginning of the line, the information typed in that line is transferred from a keyboard buffer circuit to the PSP main memory when the EXECUTE key is depressed. However, if no preliminary line number is provided, the command or program statement is executed immediately when the EXECUTE button is depressed. When the DEL key is depressed, the last character in the keyboard buffer circuit is deleted.

The PSP display unit 16 displays messages and status information on a 16-digit alphanumeric LED display 16'. The alphanumeric display is driven by a display buffer which displays the last 16 characters stored in a 256-character keyboard buffer memory. A number of individual LED indicators describe the PSP modes of operation and the test results. The indicators include VON (power applied to board under test); RUN (PSP is running a program, the test program is being executed); PASS (the board under test passed the test program); FAIL (the board under test failed the test program); NPR (no print—this keyword is operative to suppress the printing of fault messages); and DMM (the digital multimeter is ready for use).

The system command keywords shown on keyboard 12 include a number of PSP BASIC keywords, a number of "board testing keyword commands", a number of "program generation keyword commands", a file creation command, and a number of "tester operating mode keyword commands". The following is a list of various command keywords utilized in operation of the PSP system; those keyword commands followed by an asterisk (*) may be entered by pressing the CMD key and the appropriate keyword key, followed by pressing the EXECUTE key.

Board Testing Commands
CATALOG*
LOAD*
RUN*
REWIND*
DMM*
RETENS

Program Generation Commands
SCRATCH
LIST*
RESEQ
MERGE

File Creation Commands
ERASE
LENGTH
MARK
NAME*
SAVE
DATE

Tester Operating Modes
SOE*
SOF*
ROE*
ROF*
COF*
PR/NPR*
SNGL*
CONT*

The above keywords are used as system commands that are either executed immediately or are used to set the PSP in various operating modes. The PSP must be in a READY state to enter the above keywords, most of which can be entered by pressing the CMD key and the appropriate keyword key, followed by the EXECUTE key. When the CMD and keyword keys are used, the space and/or other punctuation required after the keyword will also be entered. However, if the keyword is typed using individual letters, the space and other required punctuation must be entered from the keyboard.

The above "board testing keyword commands" are used to find, load, and run a test program for a board under test, to rewind the magnetic tape cartridge, and to use the digital multi-meter. The LOAD command is used to load files from the magnetic tape cartridge or a central computer disc into the PSP memory. The RUN command is used to begin execution of the test program that is in the PSP memory. The program can be run beginning at the lowest numbered line or at a specific line number. The REWIND command is used to rewind the magnetic tape cartridge so that it can be removed without risking damage to the tape. The DMM command is used to measure voltages, currents, and resistances and to display the measurement on the LED display 16'. The RETENS command is used to create a uniform tension on the magnetic tape and operates the tape cartridge in a fast-forward mode until the end of the tape and then rewinds the tape.

The "program generation keyword commands" are used when creating new files. The SCRATCH command is used to clear the PSP memory so that a new program can be entered from the keyboard. The LIST command is used to list the statement lines in the PSP memory; selected statement lines may be listed by using the line numbers. The RESEQ command is used to renumber the line numbers in the test program, either to provide additional unused line numbers between tests, or to renumber lines prior to merging with another test program that uses the same line numbers. The MERGE command is used to merge a saved file on the magnetic tape cartridge or the central computer disc with the program in the PSP memory.

The "file creation" commands are used when creating or modifying files on the tape cartridge. The ERASE command is used to prepare a new magnetic tape cartridge for an initial marking of file space, or to erase all of the files on an existing tape cartridge for a new marking of file space. The LENGTH command is used to determine the length of the test program, high speed processor routine, and image portions of memory. The MARK command is used to create a designated number of files of a specified length on the magnetic tape cartridge. The NAME command is used to assign a name to the program in memory. The SAVE command is used to store the program that is in the PSP memory either in the magnetic tape cartridge or in the central computer disc. The DATE command is used to determine the present date assignment and to change that assignment if desired.

The tester operating mode commands are used to change the operating modes of the PSP, and are used extensively during test program debugging, and may be used during board testing to detect intermittent faults.

The SOE (stop on end) command puts the PSP into a mode of operation in which the test program execution stops at the END statement; if no faults were detected, the PASS light on display 16 is turned on.

The SOF (stop on fault) command puts the PSP into a mode of operation in which the test program execution stops at the first detected failure and FAIL light of display 16 turned on. A standard fault message is printed unless the PSP is in the NPR (no print) mode.

The ROE (restart on end) command puts the PSP into a mode of operation in which the test program execution is restarted after the END statement; the PASS light is turned on if there were no failures and the program is run again, beginning either at the first line or at a line number specified as an argument in the ROE command. The ROE mode can be used to execute the test program repetitively so that selected signals may be observed using an oscilloscope. If the ROE and SOF modes are used together, the test program will be re-run as long as the board passes all of the test, and it will stop whenever an intermittent fault causes a test failure.

The ROF (restart on fault) command puts the PSP into a mode of operation in which the test program execution is restarted as soon as a fault is detected. The FAIL light is turned on and the program is run again, beginning either at the first line or at a line number that is specified as an argument in the ROF command.

The COF (continue on fault) command puts the PSP into a mode of operation at which the test execution continues even if a fault is detected. The FAIL light is turned on but no guided-probing instructions are printed. The COF command permits execution of the entire test program to be completed regardless of the presence of a fault.

The PR (print) command is used to enable the printing of fault messages on the printer. The NPR (no print) command is used to suppress the printing of fault messages from the printer.

The SNGL (single) command is used to execute a single line of the test program; it can be used to step through the program one line at a time or to continue from a programmed STOP statement one line at a time. The CONT (continue) command is used to resume normal program execution following a programmed STOP statement or the use of the SNGL command.

Referring now to FIG. 2, the operative electronics portion of the PSP includes a complete bus-oriented data processing system 25, which includes a bi-directional three-state main bus 27 connected to six printed circuit boards, including main processor board 28, high speed pin control processor board 29, memory board 30, programmable reference board 31, panel board 32, and peripheral interface board 33.

Guided probe 13 is shown connected to high speed processor board 29 (to the priority encoder 150 thereof shown in FIG. 5) whereby a signature produced in response to probing a node of the board under test is inputted to the processor system 25.

Panel board 32 is connected to a display unit 35, which includes display 16 (of FIG. 1B) and associated electronics, including character generator circuitry and display drivers which convert information received from main bus 27 and panel board 32 into information in the format necessary to produce the desired alphanumeric readout. Keyboard and digital multi-meter unit 36 is connected to panel board 32. The readout associated with the digital multi-meter of unit 36 is displayed on display unit 16. Keyboard scanning circuitry associated with unit 36 scans keyboard 12 to identify key entries by the operator and converts the identification information to the proper format for transmission on main bus 27.

High speed pin control processor board 29 interfaces between main bus 27 (which is a sixteen bit bus) and driver/sensor boards 41, 42, and 43. Groups of conductors 45 and 47 are collectively referred to as the "pin bus"; note that the comprised conductors are not bi-directional. Reference numerals 48, 49, and 50 designate, respectively, three groups of sixty-four "pins" of the edge connectors of FIG. 1A. Each "pin" is programmable as either an input to or an output from the board under test.

Peripheral interface board 33 facilitates data transfer between main bus 27 and a printer, a tape cassette deck, a cassette deck, and acoustic coupler, and an RS232 connector unit.

In order to understand the cooperation of the elements of the PSP shown in FIG. 2 as it operates to isolate faults on a board under test, it is helpful to have a more detailed understanding of three elements of FIG. 2 which are most intimately involved in the fault isolation procedure. Therefore, before explanation of the fault isolation algorithm (of FIGS. 7A-7E) is set forth, the more important details of the driver/sensor board, the high speed pin control processor board, and the main processor board will now be set forth.

Figure 3A:
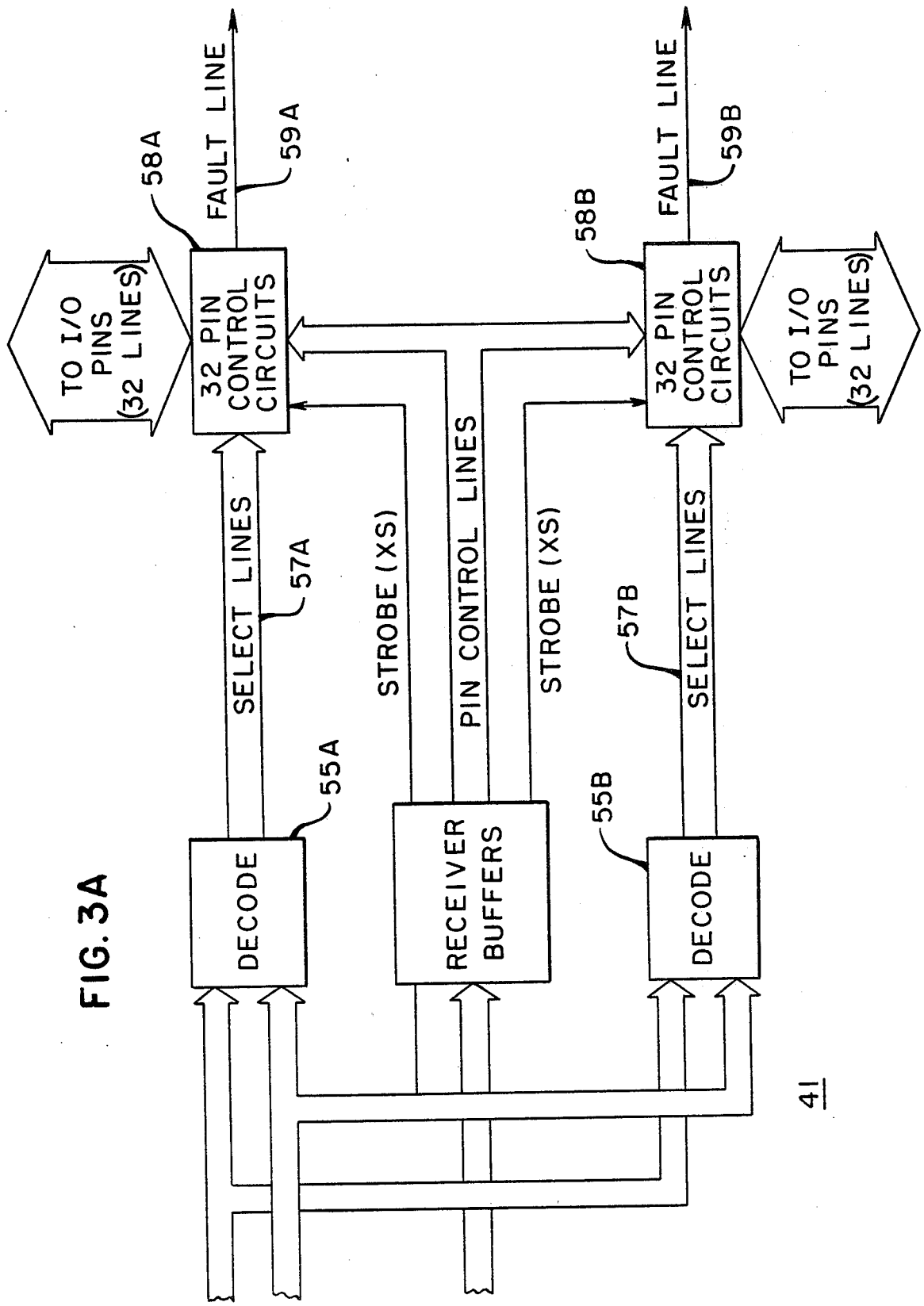
FIG. 3A is a block diagram of one of the driver/sensor boards of FIG. 2.

Referring now to FIG. 3A, the main sections of driver/sensor board 41 are depicted. (Driver/sensor boards 42 and 43 are entirely similar to driver/sensor board 41). Decode circuitry 55A and 55B together include 64 decode gates which receive an eight bit address from pin bus 47. The eight bit address specifies one of the 192 programmable input/output pins on one of the three driver/sensor boards 41, 42, 43, each of which includes 64 decode gates and 64 input/output pins. Decode circuitry 55A,B generates a select signal on the selected one of 64 select lines 57A or 57B, causing selection of one of 64 circuits in blocks 58A and 58B, occasionally referred to hereinafter as "pin control circuits". The fault lines 59A and 59B each are the logical OR of the 32 fault outputs 94 of the 32 pin control circuits 58A and 58B, respectively. (See the subsequent description of FIG. 3B). The structure and operation of decode circuitry 55 are entirely conventional, and their details are therefore not set forth herein.

Figure 3B:
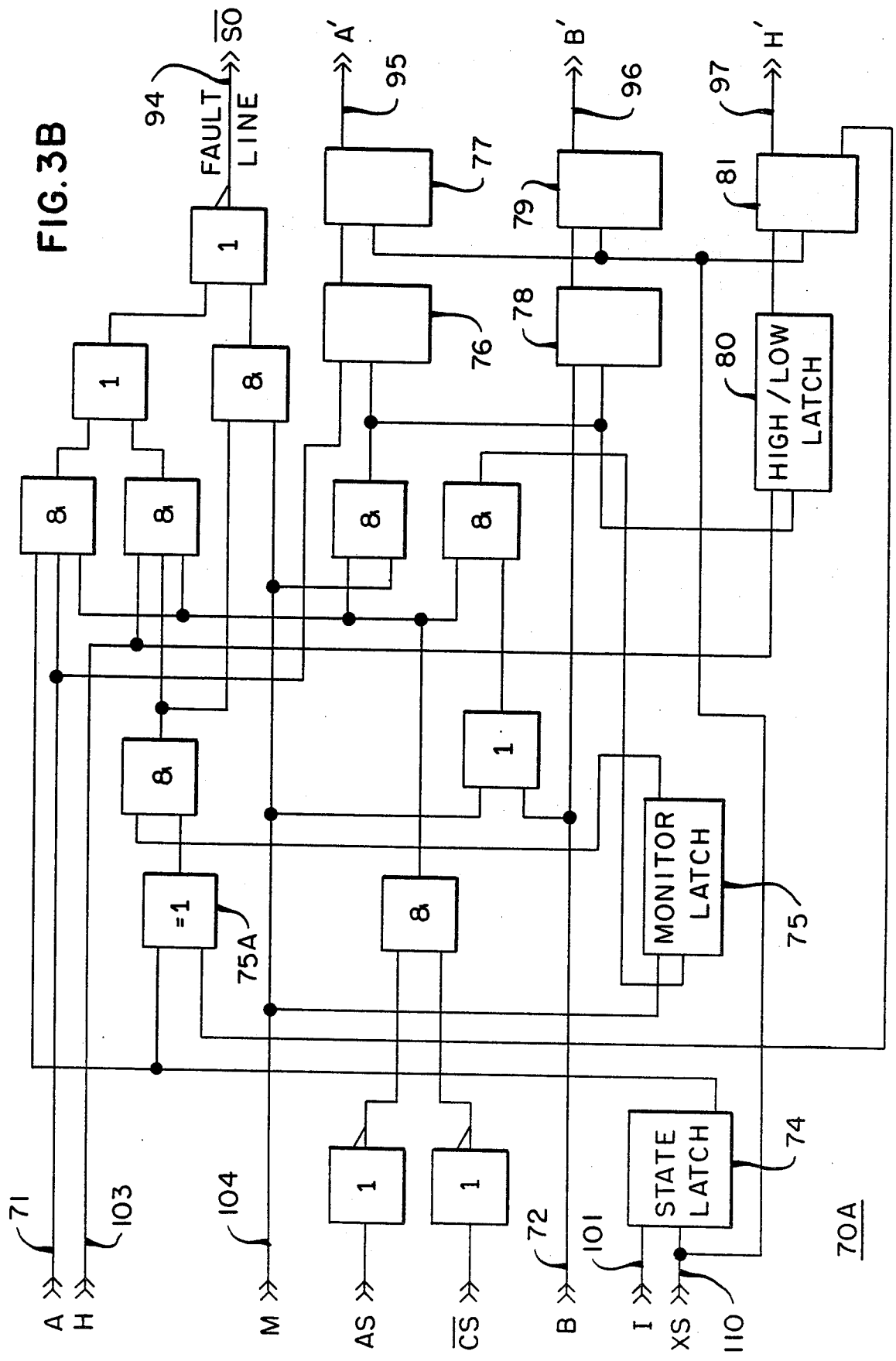
FIG. 3B is a logic diagram of part of one of the driver/sensor circuits utilized in the driver/sensor board of FIG. 3A.
Figure 3C:
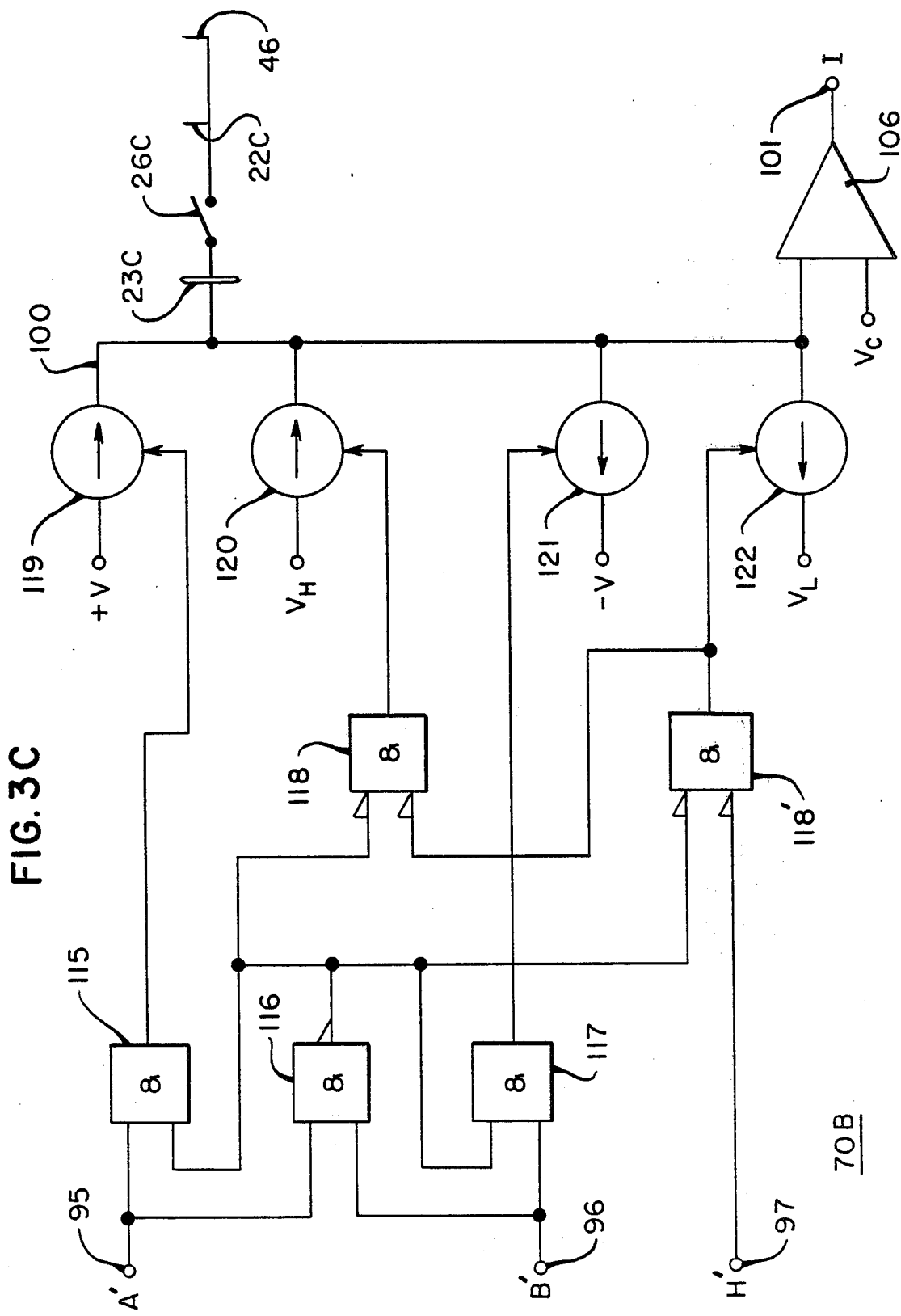
FIG. 3C is a logic diagram of the remaining portion of the driver/sensor circuit of FIG. 3B.

Each pin control circuit in blocks 58A and 58B is utilized to either drive or sense the state of an input/output in connected to that pin control circuit. Pin control 70A,B is shown connected to input/output 100 in FIGS. 3B and 3C. It should be noted that the first portion of pin control circuit 70A,B is shown in FIG. 3B and the remaining portion is shown in FIG. 3C. The remaining 191 pin control circuits of FIG. 3A are identical to pin control circuit 70A,B.

Referring to FIGS. 3B and 3C, pin control circuit 70A can provide, under program control, four separate modes of operation determined by the four possible states of the A and B inputs applied, respectively, to inputs 71 and 72. The four modes of operation include: (1) providing a logic input to input/output pin 100 of FIG. 3C, if A=B=1; if the H input applied to input 103 of FIG. 3B is a logical "1", pin 100 will be a logical "1", and if H is a logical "0", pin 100 will be a logical "0"; (2) sensing input/output pin 100 of FIG. 3C if A=B=0; (3) providing a one milli-ampere pull-up current flowing into input/output pin 100 while sensing pin 100, if A=1 and B=0; (4) providing a one milli-ampere pull-down current flowing out of input/output pin 100 while sensing pin 100 if A=0 and B=1. The above modes of operation are summarized in TABLE 1.

Referring to FIG. 3B, pin control circuit 70A includes a "monitor" latch 75 which permits the PSP to either monitor or ignore faults sensed at one or more of the output pins of the board under test. (It is emphasized that an output pin of the board under test is merely one of the input/output pins of the PSP programmed as an output). Monitor latch 75 has its information input connected to monitor input 104, to which a monitor signal designated M is applied.

TABLE 1

| A | B | H | Function |
|---|---|---|---|
| 0 | 0 | X | Sense (three-state) |
| 1 | 0 | X | Sense (1 ma. source) |
| 0 | 1 | X | Sense (1 ma. sink) |
| 1 | 1 | 0 | Drive to $V_L$ |
| 1 | 1 | 1 | Drive to $V_H$ |

Pin control circuit 70A also includes a "state" latch 74 having its information input connected to input 101. If pin control circuit 70A is programmed as a receiver, the information actually detected at the corresponding output of the board under test is detected by comparator 106 in FIG. 3C and produced as signal I on node 101, which is fed back to the input of state latch 74.

Pin control circuit 70A includes a first rank of latches, including latches 76, 78, and 80 (FIG. 3B) having their information inputs connected, respectively, to A input 71, B input 72, and H input 103. The clock inputs of latches 76, 78, and 80 are generated by various ones of the logic gates shown in FIG. 3B. The details are not important to the invention and will not be discussed in further detail. (The terms "latch" and "flip flop" are used interchangeably hereinafter.)

Pin control circuit 70A includes a second rank of latches including 77, 79, and 81 having their information inputs connected, respectively, to the outputs of latches 76, 78, and 80, which constitute a first rank of latches. Clocking inputs of latches 77, 79, and 81 are connected to strobe input 110. (Latches 76, 77, 78, 79, 80, and 81 are implemented using the circuit of FIG. 3D). This feature permits the PSP to apply input pin changes either sequentially, wherein one input pin changes state at a time, or in the so-called "broadside" mode, wherein all of the input pin changes to the board under test occur at the same time. After a programmable strobe pulse following the input pin change, the outputs of the board under test are simultaneously stored in the state latch where they can later be tested to produce a signal indicative of whether any one or more of the outputs of the board under test failed.

This operation is accomplished by storing (1) the desired input to the board under test or (2) the expected result from the board under test in latch 80 (also referred to as the "High/Low Latch") of each of the pin control circuits 70 utilized to test the board under test. After all such information has been sequentially received from the processor and stored in high/low latch 80 of each utilized input/output pin, a strobe pulse XS is applied to strobe input 110, which simultaneously transfers the input test pattern to all of the inputs of the drive portions 70B of the pin control circuits 70A,B which have their input/output pins 100 coupled to inputs of the board under test.

The group of logic gates 115, 116, 117, 118 and 118' of FIG. 3C receives the signals A' and B' from the second rank latches 77 and 79, respectively, and utilizes the A' and B' signals to drive current source circuits 119, 120, 121 and 122 according to the truth table of Table 1. (As mentioned previously, A', B' and H' assume the values of A, B and H when strobe signal XS is applied.) Current source circuit 119, when enabled by the output of AND gate 115 as a result of the condition A=1, B=0, produces a one milli-ampere current into input/output node 100, while the other three current source circuits remain off. Similarly, current source circuit 121 pulls one milli-ampere out of input/output pin 100 if A=0 and B=1. Current source circuit 120 charges node 100 to $V_H$ volts if A=1 and B=1. Finally, current source circuit 122 dries I input/output pin 100 to $V_L$ volts if A=1 and B=1.

Input/output pin 100 of FIG. 3C is connected to driver/sensor stake pin 23C and one terminal of switch 26C. The other terminal of switch 26C is connected to edge connector stake pin 22C and to edge connector pin 46, which contacts a corresponding pin of the board under test, thereby effecting communication of information between the driver/sensor circuit 70A,B and the board under test. More detailed information is presented in the above-incorporated copending Phelps application.

One skilled in the art could readily verify that the logic gates in FIG. 3B implement the truth tables of Table 2 and Table 3 in the course of detecting faults at input/output pin 100 for the several modes of operation.

Essentially, the operation is that if the TF (test fault on any pin) or TMF (test monitored fault) functions are generated as a result of the logic signal inputs indicated in Table 2, fault line 94 of FIG. 3B will be at a low level if there is a detected fault on input/output pin 100 and will be at a high level if there is not a detected fault at input/output pin 100.

TABLE 2

| CS | M | B | A | H | FUNCTION |
|----|---|---|---|---|----------|
| X  | 0 | 0 | 0 | 0 | No operation |
| 0  | 1 | X | X | X | Test Fault (any fault) |
| 1  | 0 | 0 | 0 | 1 | Test monitored fault |
| 1  | 0 | 0 | 1 | 0 | Test state |
| 1  | 0 | 1 | X | X | Neglect (i.e., not monitored) |
| 1  | 1 | 0 | 0 | 0 | Output low |
| 1  | 1 | 0 | 0 | 1 | Output high |
| 1  | 1 | 0 | 1 | 0 | Output low: 1 ma. pullup source |
| 1  | 1 | 0 | 1 | 1 | Output high: 1 ma. pullup source |
| 1  | 1 | 1 | 0 | 0 | Output low: 1 ma. pulldown sink |
| 1  | 1 | 1 | 0 | 1 | Output high: 1 ma. pulldown sink |
| 1  | 1 | 1 | 1 | 0 | Input I = low |
| 1  | 1 | 1 | 1 | 1 | Input I = high |

TABLE 3

| Function | Condition | SO̅ |
|----------|-----------|----|
| Test fault or test monitored fault | no fault | 1 |
| Test fault or test monitored fault | fault | 0 |
| Test state | state reset | 0 |
| Test state | state set | 1 |

It should be recalled that there are 192 pin control circuits such as 70 and the three driver/sensor boards of FIG. 2. Six groups of thirty-two fault lines such as 94 are logically ORed to provide six groups of "group fault lines" which are inputted to the priority encoder 150 of the high speed processor of FIG. 5, as described subsequently. The cable 13' to guided probe 13 is utilized as another input to the priority encoder 150.

Once an indication of a detected fault is received by the high speed processor, information representative of that fault will be routed by the high speed processor to the main bus 27, where it is transferred to the main processor 28. The main processor then acts upon such fault information.

It should be noted that the "fault lines" can actually contain three different types of information. First, they can include information that at least one pin of the board under test has a fault detected thereon. Secondly, the fault line can convey information which indicates that a particularly addressed pin has a fault detected thereon. Finally, the fault lines can conduct information which indicates whether the address pin is high or low. The latter mode is used to read data from the pin of the board under test and shift it into the shift register.

The control inputs A, B, and M, to pin control circuit 70A determines whether the fault line output 94 (SO̅) indicates the latched logic state of an addressed input/output pin, the presence of a fault on an addressed, monitored input/output pin, or the presence of a fault on any one of the pins that are monitored. This flexibility enables a system to test all 192 input/output pins in parallel to determine whether any fault exists on any monitored pin. If any such fault does exist, the system then addresses each input/output pin in a predetermined polling sequence and tests for faults.

It should be noted that the PSP can simulate either a "broadside" type of tester or a "skew" type of tester, even though the PSP is basically a "skew" or sequential type of tester which tests one input/output pin at a time. However, by means of the double rank of flip flops in each of the pin control circuits such as 70A,B of FIGS. 3B and 3C, the sequentially applied information may be stored in the first rank of flip flops (i.e., flip flops 76, 78, and 80 in FIGS. 3B) and then simultaneously strobed into the second rank of flip flops (i.e., 77, 79, and 81 in FIG. 3B) and to the input/output pins of the board under test during the leading edge of XS. The "broadside" mode is frequently more convenient for testing boards or devices which have microprocessor busses therein. (In some cases it is also convenient for the PSP to be able to emulate other "broadside mode" testers, so that test programs previously written for such "broadside mode" testers can be easily translated for use in the PSP. It should be recognized that test programs written for broadside testing of a board under test ordinarily would not properly test the board under test when applied sequentially to the inputs thereof.)

There are six XS strobe lines such as 110 of FIG. 3B, one for each group (such as 58A of FIG. 3A) of thirty-two pin control circuits, for strobing information stored in the high/low latches (such as latch 80 of FIG. 3B) of each group of thirty-two pin control circuits into the second rank of latches (such as latch 81 of FIG. 3B). This strobing occurs on the leading edge of XS. On the trailing edge of the XS strobe signal, the detected response (I) of the board under test to the inputted test pattern received from each of the output pins of the board under test is strobed into the corresponding state latch 74 of FIG. 3B from the output 101 of comparator 106 of FIG. 3C.

As mentioned previously, the expected state response of the board under test for each driver/sensor circuit is initially entered in the high/low latch 80 by means of the H input. The expected state is strobed into latch 81 during the leading edge of XS. The output of latch 81 is inputted to exclusive OR circuit 75A of FIG. 3B. The actual detected response state of the corresponding output of the board under test is the signal I, which is inputted to state latch 74 during the trailing edge of XS, from whence the actual response is inputted to exclusive OR circuit 75A, whereby a fault signal is produced if the detected response of the board under test is different then the expected state.

Referring now to FIG. 5, high speed pin control processor 29' (which mainly constitutes the circuitry on board 29 of FIG. 2) interfaces between main bus 27, which is a 16 bit bus, and "pin bus" 45, 47 which consists of approximately twenty lines which are outputted to or received from the three driver/sensor boards 41, 42, and 43. (For convenience, high speed pin control processor 29' is hereinafter referred to as the HSP, i.e., the High Speed Processor).

Pin bus input conductors 45 include the six logically ORed "group fault lines" such as 59A and 59B shown in FIG. 3A. The group fault lines each conduct the logical OR function of thirty-two fault lines such as fault line 94 of FIG. 3B. Pin bus conductors 45 also include the probe conductor 13' of FIG. 2. Pin bus output conductors 47 include the above-mentioned eight bit address bus which is used to select one out of the 192 pin control circuits. Pin bus output conductors 47 also include the A, B, H, M, XS, and AS inputs to the pin control circuit shown in FIG. 3B.

Still referring to FIG. 5, clock circuit 153 includes a number of conventional counters, registers, flip flops, and some control gating circuitry to produce high speed programmable clock signals utilized to control the operation of the HSP. The range of the cycle times of the programmable clock signals is from 150 nanoseconds to approximately 12.5 microseconds, in 50 nanosecond increments. Clock circuit 153 includes a register which is loaded from main bus 27 to determine the programmable cycle time of the HSP. The cycle time of the HSP controls the rate at which PSP 10 switches from one input/output pin to another during the testing of the board under test. Clock circuit 153 may be readily implemented utilizing Texas Instruments 74LS175 latches, 74S74 flip flops, and 74S161 counters as the main components thereof.

Controller buffer 154 is simply a means for permitting main processor 28 (FIG. 2) to read the address currently being executed by the HSP. Its main utilization is as a diagnostic feature. It may be implemented utilizing Signetics 8T97 buffers as the main component thereof.

Status register 155 is a read/write register which contains various flags and status information. There are a number of input and output signals routed between status register 155 and various gates in the PSP, as indicated by reference numerals 156 and 157. One bit of the status register specifies whether the PSP is operating in the above-mentioned "broadside" mode or in the "skew" mode, the latter being the mode wherein one input/output pin at a time is changed. Some of the information, for example a "run/stop" bit and three program flags, in status register 155 come from main processor 28. Other information in status register 155 comes from within the HSP itself, such as the status of the fault lines, and the status of data in register 159 and the data out register 160. Main processor 28 is capable of reading status register 155 as a memory location, while the HSP utilizes status register 155 as a source of control signals. Status register 155 may be readily implemented utilizing Texas Instruments 74LS174 registers and Signetics 8T97 buffers.

Data in register 159 and data out register 160 simply constitute latches with three-state outputs. They are readily implemented utilizing Signetics 8T10 three-state latches.

Random Access Memory (RAM) 163 is organized as 1024 words by sixteen bits. The instructions for the HSP are stored in RAM 163. Data utilized in conjunction with the high speed port 170 and the high speed bus 45' may also be stored in RAM 163.

Shift register 166 is a sixteen bit parallel-loadable, parallel-readable shift register. A CRC character from CRC generator 180 can be serially shifted into shift register 166 so that the CRC character can then be read out in parallel format into bus 161 (which is an internal 16 bit bus of the HSP) and to main processor 28 via data out register 160 and main bus 27. There is a single line 201 from the pin control electronics circuitry 151 to the serial input of shift register 166 which permits rapid reading of sixteen input/output pins from the board under test by main processor 28. The state of such input/output pins can be rapidly shifted by means of sixteen shift operations into shift register 166, so that main processor 28 may then read this information out in parallel format, via internal HSP bus 161 and data out register 160. This capability is useful in testing microprocessor based boards. Shift register 166 may be readily implemented utilizing Texas Instruments 74S299 shift/storage registers as the main component.

The HSP has a "shift data out" instruction which is capable of specifying the values of the H, M, A, and B inputs to an addressed one of the pin control circuits such as 70A,B of FIGS. 3B and 3C. Such information could be specified by instructions from main processor 28, but if desirable, it can be instead incorporated into the information loaded into shift register 166 and shifted out to conductors of pin bus 47 by the information in Instruction Register 169, by means of sixteen shift operations, to the addressed pin control circuit 70A,B via pin control logic circuitry 151 of HSP 29'. This capability is useful for rapidly transferring information on main bus 27 to the board under test. For example, this may be advantageous for testing a board under test which incorporates a microprocessor since it will usually then be necessary for the PSP to rapidly provide sixteen bits of information to the microprocessor bus of the board under test. See the above co-pending Phelps application for further detail.

Micro-controller 165 is implemented utilizing an Advanced Micro Devices 2911 integrated circuit microcontroller, which is essentially an address controller, i.e., an address sequencer. It contains the next address for accessing RAM 163. Micro-controller 165 has subroutining capability and looping capability.

Multiplexer 167 has a number of inputs from the priority encoder section 150 of control logic circuitry 151 and Instruction Register 169. The priority encoder has four outputs. One of them indicates whether any of the six group fault lines such as 58A or 58B of FIG. 3A indicates a detected fault on an input/output pin. The other three outputs indicate which of the six group fault lines has the highest priority of those which have detected fault signals. Normally, in order for the HSP to execute branch operations, the jump instruction is put into Instruction Register 169. The lower order ten bits of the instruction are fed into multiplexer 167 and from there into the controller 165. The jump instruction is then executed. The HSP includes a "jump on sub-fault" instruction which immediately vectors through a particular address based on the four outputs from the priority encoder. The function of the multiplexer 167 is to enable this vectored branch operation to be accomplished. The multiplexer may be implemented utilizing Texas Instruments 74LS157 Data Selector/Multiplexer as its main component.

Counter 168 may be implemented utilizing Texas Instruments 74S161 counters. Counter 168 is utilized by the HSP to execute loop instructions. The HSP includes a "decrement counter and branch if not zero" instruction, wherein the counter is decremented by one. If the contents of counter 168 are equal to zero, a flag bit in status register 155 is set. There is a register in the micro-controller 165 which contains an address vector to branch to if the counter contents are not equal to zero.

As mentioned previously, the output from probe 13 is inputted to priority encoder 150 of HSP 29'; see FIG. 5 and FIG. 2. The data stream received from probe 13 (as a result of probing a node of the board under test) is inputted via conductor 179 to the inputs of CRC character generator 180 and pin state RAM 181. Pin state RAM 181 is a thousand bit serial RAM. The first thousand states of the probed node are stored in pin state RAM 181, and from this information, which is inputted to the main processor, the input test number of the first transition of the probed node is determined and stored in the history table in the main memory, as subsequently described. If no transition of the probed node occurs during the first thousand tests, a maximum possible input test number is stored in the history table to insure that the probed node is not found to be the source of an error in a loop in the circuitry of the board under test, as will become apparent subsequently.

Alternatively, a circuit 181' may be used instead of pin state RAM 181 to detect the time (i.e., the input test number) of the node being probed. This input test number is then inputted directly in parallel format to the main processor 28 via main bus 27. Circuit 181' is easily implemented utilizing a counter, a flip flop which stores the initial state of the node being probed, and some exclusive OR type circuitry.

High speed processor (HSP) 29' has a limited instruction set which is oriented to manipulation of pins of the board under test and sampling results therefrom. The HSP has two independent modes of operation. First, it is capable of operating in the "bypass" or single step mode. In this mode, an instruction is issued from the main processor into the HSP. The HSP merely acts as a translation device and a timing device to facilitate transfer of the instruction into the pin subsystem. Referring to FIG. 5, the instruction is transferred from main processor 28 onto main bus 27, and from there to bus 161 of the HSP and from there to "pin bus" conductors 47 via instruction register 169 and pin control circuitry 151.

Pin control circuitry 151 includes various gating circuits which may be readily implemented by those skilled in the art to provide the necessary gating and buffering functions in response to signals from conductors 172 of ROM 171 to shift information from shift register 166 or instruction register 169 to appropriate conductors of pin bus 47. For example, eight bits of instruction register 169 merely provide the address to select one of the 192 driver/sensor circuits; these eight bits are coupled to the corresponding conductors of pin bus 47 by means of conventional buffer circuits in pin control circuitry 151. Other signals of pin busses 47 and 45 involve controlled gating functions which are more complex, but which may be straight-forwardly implemented.

The HSP operation in the bypass mode is such that the HSP is actually executing its own instructions. In the bypass mode, the ROM portion of the HSP is continually sampling data in register 159. Whenever data is detected in data in register 159, such data is transferred to the bus 161 and brought into instruction register 169, where some of it is decoded by read only memory 171 to produce the necessary enabling signals on conductors 172 to transfer the instruction or data to the appropriate lines of "pin bus" conductors 47 via pin control logic circuitry 151. The HSP then attempts to fetch a next instruction from RAM 163, but is caused to drop back into its HALT state.

The second mode of operation for the HSP is the "process" mode. In this mode, the higher eight bits from instruction register 169 go into ROM 171, and are decoded to produce control signals on conductors 172, which are routed to the various other elements of the HSP to control the sources and destinations of data transfers within the HSP. To load the HSP RAM 163, the HSP will typically execute a jump to a location called "address minus one", the address being the address of the instruction which is desired to be loaded from RAM 163. The instruction is loaded into instruction register 169 via bus 161, and from there is routed via multiplexer 167 into microcontroller 165. Microcontroller 165 is automatically incremented as it starts to fetch the contents of the addressed location. The HSP then goes into the HALT mode at this point, and the address register of the RAM is loaded. Typically, the next instruction would be to move data into the addressed location of the RAM.

High speed processor (HSP) 29' may be utilized to perform several functions in the PSP. The HSP may be utilized as a clock generator to facilitate testing of boards which require high speed clock inputs. A program may be stored in RAM 163 to generate such clocks. While the HSP is generating such clocks, it allows interrupts from main processor 28 at appropriate times. The main test program for the board under test is, of course, stored in main processor 28. Main processor 28 may thus be operated in an interleaving fashion with the HSP while the HSP is functioning as a clock generator, thereby providing both the required test patterns for the board under test and the high speed clocks required by the board under test. For more detail, see the copending Phelps application.

The HSP is also utilized to function as an interpreter of high level commands from main processor 28 to facilitate interfacing between main bus 27 and pin bus 45, 47 of the PSP. In this mode, a small interpreting microprogram is stored in the HSP RAM 163 to interpret the particular manner in which information on main bus 27 must be "fanned out" to the desired input/output pins of the board under test. Thus, when the microcode stored in the HSP receives a higher level command from main processor 28, the microcode routes that command out to the proper pin of the device under under test. See the discussion regarding the "shift data out" instruction in the co-pending Phelps application.

The HSP may also perform a synchronizing function to enable the PSP to be synchronized with a board under test which generates its own timing. In this mode, the microcode stored in the HSP utilizes a WAIT instruction to "freeze" the rest of the PSP until a specified signal from the board under test changes. At this point, the HSP can further execute its own microcode, or it can interpret further instructions from main processor 28 to facilitate further execution of the test program for the board under test. For more detail, see the co-pending Phelps application.

This is an important advantage, because even most known "factory testers" encounter serious problems testing asynchronous devices such as microprocessor based devices. It is frequently necessary to unplug the microprocessor of such a board and test only the other components of the board under test, or to design special features into such boards to facilitate testing, thereby adding cost to the product.

Another application of the "shift data out" instructions is in utilizing the PSP as a read only memory programmer. The shift register instructions are utilized to "set up" address pins of the read only memory to be programmed, using a "shift data out" instruction. Similarly, the data pins are also "set up" using "shift data out" instructions. In order to verify the data written into the read only memory to be programmed, "shift data in" instructions are utilized to get the data into the shift register and from there into the main processor, which makes the determination whether the data written in is correct.

The X port circuitry 170 provides buffering between high speed bus 45' and internal HSP bus 161. This bus can be used in certain instances to enter into the system at high speed. For example, a high speed psuedo-random number generator could be connected to HSP bus 45' to provide psuedo-random input test patterns to the board under test.

Peripheral interface board 33 is responsible for generating address decoding and bus reply signals for all peripherals in the system, regardless of which board the peripherals are associated with. Peripheral interface board 33 produces the function of interfacing between main bus 27 and the peripheral subsystem, which includes a 3M tape deck, a cassette deck, a printer, an RS 232 connector, and an acoustic coupler. A block diagram of the peripheral interface board 33 is shown in FIGS. 6A and 6B, wherein the main bus 27 includes various conductors inputted to the address decode circuits 251, 252, and 253, and to the two USARTs (universal synchronous/asynchronous receiver transmitter) 254 and 255 and to tape interface unit 256. The USARTs may be readily implemented by commercially available integrated circuits such as the Intel 8251. Printer control circuitry 260 essentially includes an eight bit latch, a flip flop, and some buffers. Bell-system-compatible MODEM 261 may be implemented by a wide variety of commercially available modems, manufactured by companies such as Cermetek.

Reference board 31 is also connected to the main bus 27 to receive information to control fourteen programmable voltage supplies which may be set by 0.1 volt increments, to voltages in the range from −12.8 volts to +12.7 volts by means of various commercially available digital-to-analog converter integrated circuits, such as the Motorola MC 1408L. Nine of these fourteen programmable voltages are utilized to program the pin control circuit's voltage levels on the three driver/sensor boards. These voltages can be programmed to set logical levels which are compatible with any combination of three different logic circuit technologies on the board under test, for example, transistor-transistor logic, MOS logic, and emitter coupled logic. For each different set of logic levels, a preprogrammed value is established for a logical 1, a logical 0, and a threshold level. Reference board 31 also provides two control signals which control the fixed +12 volt and −12 volt levels which may be supplied to the board under test. Reference board 31 also provides four other programmable reference voltages for four programmable power supplies which may be connected to the board under test. A fourteenth power supply is programmable to set the reference voltage for the probe. Reference board 31 is programmable from the keyboard.

Panel board 32 is responsible for accepting keyboard inputs from the operator. The panel board also contains logic circuitry for controlling digital multimeter (DMM) capable of handling measurements of voltage, resistance, and current and displaying the readings of the DMM.

Referring to FIG. 4, processor board 28 mainly includes a microprocessor chip system 210 which may be implemented utilizing the Western Digital MCP1600 microprocessor system integrated circuit chip set. This microprocessor system includes a data chip 212, designated by the manufacturer as the CP1611B, which mainly performs the function of providing an arithmetic logic unit, various registers including an instruction register, and address system, I/O gating, and other such elements required to perform classical stored program processing. The chip set also includes an integrated circuit 211, referred to by the manufacturer as the control chip and designated by the manufacturer as the CP1621B; it is in essence a custom programmable logic array which is implemented by the manufacturer to accommodate the individual user's instruction set. The individual user's instruction set is decoded by a chip 213 referred to as the microcode chip or ROM chip, designated as the CP1631B, which is a 512 word by twenty-two bit read only memory which decodes the user's preferred instruction set to produce signals necessary to make the MCP1600 MPU system operate, such as precharging the MOS bus 27' every cycle of operation. However, additional read only memories may be coupled to bus 27' to provide microcode to implement additional instructions which the user may wish to have.

FIG. 8 discloses some of the basic internal elements of a processor implemented by microprocessor chip system 210 of FIG. 4. Referring now to FIG. 8, input/output buffer circuitry 273 controls the inputting and outputting of instructions, data, and address information between internal bus 27' and main bus 27. Microprocessor chip system 210 includes an arithmetic and logic unit 278 for performing various arithmetic operations and may be implemented using various well known circuitry and logic implementation techniques. Arithmetic and logic unit 278 is coupled to internal bus 27' by means of a plurality of conductors 279, which include conductors for inputting operands into arithmetic and logic unit 278 and conductors for receiving the results of computations from arithmetic and logic unit 278.

Microprocessor chip system 210 further includes a register section 276 including a plurality of registers each coupled to internal bus 27' by means of conductors generally indicated by reference numeral 277. The various registers in register section 276 typically include a program counter, a stack pointer, an index register, one or more accummulators used in conjunction with arithmetic and logic unit 278, a register for storing flags, and various other temporary registers. An instruction register 280 is coupled to the internal bus 27'. The instruction is decoded by means of instruction decoder 283, which produces control signals on conductors 281, which are respectively routed to all of the elements shown in microprocessor chip system 210 in order to effect the data transfer and gating function necessary to execute the current instruction.

Still referring to FIG. 8, a memory system 286 is shown connected to main bus 27. Memory system 286 includes a memory array, which can include various subsections, such as 288 and 288' etc. The memory array may be subdivided into various subsections of memory space defined by address boundaries established in the main program. Parts of the memory space may include random access memory cells, and other parts of the memory space may include read only memory cells or programmable read only memory cells. Typically, the storage array is composed of a plurality of integrated circuit chips (not shown), each including internal address decoding and input/output circuitry. Circuitry 287 includes data input/output buffers and address registers connected, respectively, to the memory array by means of memory data bus 291 and memory address bus 290.

More detailed information concerning typical classical data processing functions performed by a microprocessor system is set forth in U. S. Pat. No. 3,962,682 by Bennet, et al, filed Sept. 17, 1975, and issued July 19, 1977, and in patents related thereto.

It should be noted that the particular instructions executable by main processor 28 are not essential to the fault isolation and loop breaking features of the present invention. Any processor of suitable capacity having any one of a wide variety of different instruction sets could be utilized to implement the algorithm of FIGS. 7A–7F such that the PSP of the present invention would perform the disclosed and claimed fault isolation tasks.

The power-on-reset circuitry 217 of processor board 28 waits until the power supply voltages are stable and then generates "power on reset" pulses which cause the microprocessor system to fetch the first instruction out of a fixed memory location to initially get the microprocessor system running.

Interrupt circuitry 220 of processor board 28 interrupts the microprocessor to accommodate operator "attention" signals from the keyboard and "bus ready" signals from the memory. Interrupt circuitry 220 inhibits the processor 28 from accessing memory 30 (see FIG. 2) while memory 30 is being refreshed. Attention input ATTN is the only hardware interrupt the system has. When the microprocessor system is interrupted by the attention signal, it finishes executing the current instruction, and initiates execution of an interrupt subroutine wherein it polls the various devices in the system capable of interrupting the processor to determine the source of the interrupt. It then determines the appropriate action in response to the interrupt and carries out that action.

Memory board 30 of FIG. 2 includes the main memory of the PSP, and performs the function of storing the test program for the board under test and the image and signature file for the board under test, and the fault isolation algorithm, discussed subsequently.

In the discussion herein, it is assumed that the device under test is a printed circuit board. The PSP initially subjects the board under test to a "go-no-go" test by applying a pattern of logic signals established by the test program for that board to the input pins of the board under test and comparing the responses from the output pins of the board under test with the known correct responses for the board under test. The known correct responses are stored in the test program stored in the PSP memory and are temporarily loaded into the high/low flip flops of each of the pin control circuits 70A, B, as previously explained, if pin state testing is performed for the go-no-go test. (If the go-no-go test is performed using signature analysis, the signatures are produced in response to the outputs of the board under test and compared with known correct signatures stored in the signature file.) If the board under test passes, a "pass" signal is flashed on the display unit. The board under test is then unplugged from the PSP and the operator then replaces it by the next board to be tested.

However, if the board under test fails the go-no-go test, the PSP then must determine which output pins of the board under test failed. To determine which output pin or pins of the board under test failed the go-no-go test, the PSP executes a simple polling routine, wherein it addresses one output pin of the board under test at a time and tests it by comparing it with its expected result, thereby identifying all faulty output pins. The details of the polling routine are very simple, and are therefore not set forth.

The PSP then enters a diagnostic mode to isolate the fault. The PSP automatically displays probing instructions on its display, instructing the operator to probe a particular node selected by the fault isolation algorithm. The fault isolation algorithm described hereinafter directs the operator's probing from node to node along a path from a faulty output pin of the board under test toward the input pins of the board under test, and isolates the faulty component of the board under test so that it can be repaired "on the spot" by the operator, thereby avoiding the necessity of "board swapping".

The PSP tests the board under test according to a "test program" for that board type stored in the main processor memory. The test program determines which input test signal patterns will be applied to the various inputs of the board under test and also determines which output patterns will be expected on the various outputs of the board under test in response to the applied input test signals. The purpose of the test program is to exercise the circuits on the boards so that the faulty operation resulting from a faulty response at any node in the board under test can be detected at the outputs of the board under test. The test program input patterns must accomplish two things to detect a fault. First, they must exercise all circuit nodes to test whether any node does not respond correctly. Second, the input test patterns must make any such incorrect response at an internal node of the board under test apparent at the output pins of the board under test.

The PSP uses a modified version of the well-known BASIC language for both the control commands and the test programming language. Since standard BASIC does not contain statements for printed circuit board testing, the modified BASIC language, referred to hereinafter as PSP BASIC, has been augmented by "test statements" which are similar to those used by the majority of the commercial test system now in use. These test statements specify input/output pins as inputs to or outputs from the board under test and set the logic levels on these input or output pins high or low. Faults on specific output pins can either be monitored or neglected. Further, specific output pins can be tested, and then the test program can jump to different routines, depending upon the logic states sensed from such output pins.

The portable service processor (PSP) of the present invention responds to a test command from the keyboard to perform a go-no-go test on the board under test. The go-no-go test is performed at very high speed, and if the board under test "passes", a display device indicates that the device "passes" the test within approximately one second. All of the output pins from the board under test are simultaneously tested during the go-no-go test. If a visual "pass" indication is received, the operator simply removes the board under test (or the cable connectors if some device other than a board is being tested) and connects the next board to be tested.

If the board under test does not pass the signature analysis test at each output node, the PSP then goes into an "automatic guided probe" signature analysis testing procedure wherein the display unit informs the operator, on a node by node basis, which node to probe next. The various nodes of the board under test of product under test are identified by any convenient means, such as labeling the components by letters, as shown in FIG. 1A, so that such nodes are readily recognizable by the operator.

Guided probing is a fault isolation concept that requires a data base in addition to the test program for the board under test. The data base consists of an "image" of the board under test, which "image" describes all of the circuit interconnections. The data base also consists of the nodal responses which are previously "learned" from a known good board under test. When the test program is executed by the PSP, a "fault" that propagates to an output pin of the board under test will cause incorrect signature responses at all nodes along a path from the defective element or condition causing the fault to that output pin of a board under test. The PSP system software implements the guided probing concept by determining the sequence of nodes that an operator should probe to lead back from the failing output pin of the board under test to the fault therein, as explained subsequently, with reference to FIGS. 7A-7B. At each logic element (which typically is an integrated circuit) along this path, if an output pin of the element under test has an incorrect response, the guided probe algorithm leads the operator back to the previous logic element in the path. The guided probing sequence continues instructing the operator to probe nodes along the path of bad node responses until reaching a logic circuit that has correct input responses at all of its input nodes and a faulty output response. That incorrect output response is at the location of the faulty node. This node is labeled with the logic element name or location and output pin number. A load list is provided which includes the input pins of other logic elements or integrated circuits to which that signal fans out. The actual fault may be the driving logic circuit or integrated circuit, the input of the receiving integrated circuit, or a defect of the node conductor connecting the two.

Several types of stored responses are utilized in the PSP to provide fault isolation resolution to a single node. These responses are automatically "learned". In the "learn" mode, the PSP measures all of the signatures at the board under test inputs and outputs and at the output pins of each logic element or integrated circuit in the board under test. The purpose of the learn mode is to enter the signatures from a known good board under test into the signature file (which, as previously mentioned, is actually a part of the image file). The PSP runs the test program in the ASIG mode, to be subsequently described, once for every output pin of the board under test. This procedure automatically updates the signature file for all of the output pins of the board under test. The learn mode algorithm then specifies the first logic element (that it finds in the image file) output pin. It then tells the operator to probe that output pin, and if the signature in the file is not the same as the signature detected, the file is updated with the newly detected signature (once some precautions to detect misprobing of intermittent probe contact are taken). This procedure is repeated for each node of the board under test identified by the learn mode algorithm, until the known correct signatures for all nodes specified in the image file have been updated, or "learned" by the PSP.

The "verify" mode is used as a "double-check" for both the learned signatures and the interconnections specified in the image file. A signature is measured at each logic element or integrated circuit input pin of the board under test. If the measured signature obtained in testing the known good board under test does not match the previously "learned" signature from the same node for the same board under test, the PSP indicates the mismatch. This permits the operator to identify and correct various possible causes of the mismatch, including errors such as (1) probing the wrong node during the learn mode, (2) presently probing the wrong node during the verify node, or (3) the presence of an image error due to improper description in the image file of the topology of the board under test.

The PSP stores an "image file" loaded into the main processor memory from the tape deck. The image file contains information which defines all of the interconnections between the nodes and components of the board under test.

During "probing" of each node, the test program stored in the PSP applies the appropriate input test pattern to the inputs of the board under test, generating a bit pattern at the node being probed as the operator holds probe 13 on the indicated node. The data measured at that node is inputted to a CRC signature generator 180 (FIG. 5), which produces a CRC signature which is compared to a known good signature (which is fetched from the signature file by the main processor) for the node being probed. As the path from the faulty output pin of the board under test is consecutively traced along a circuit path or paths toward one or more inputs of the board under test by sequentially probing nodes along such paths, faulty signatures will be found at each probed node of a path until, as explained above, a faulty node is found which is the output of a component having error free signatures measured at all of its input nodes. This component is probably the faulty component. At this point, the automatic fault isolation algorithm causes a message to be printed, indicating to the operator that the "probable fault" is that particular component is defective; the operator can then usually repair the board under test by replacing that component with a known good replacement component.

It should be noted that each such probing operation takes only approximately ten seconds. The operator does not have to refer to any complex documentation concerning either the PSP or the device or board under test; he only needs to be able to identify the node which needs to be probed on the basis of the identifying message printed out and/or displayed on the PSP display and place the probe tip on that node so that reliable electrical contact is made with that node.

In most cases, the probable fault indicated above will indeed be the actual fault. However, this may be not true if certain circumstances exist. For example, there could be an "open" circuit because of a broken printed circuit conductor. The fault isolation algorithm of FIGS. 7A–7H tests for such conditions by instructing the operator to probe different points of a conductor and comparing the signatures of such different points any time an incorrect signature is measured for a node, as subsequently explained.

In essence then, applying the guided probe/signature analysis technique of fault isolation to a board under test, according to the invention, involves initially performing a go-no-go test at each output of the board under test by performing a single state test comparison of each output with the known correct state of that output for a given configuration of input states. If any output pin of the board under test fails the go-no-go test, the fault isolation procedure then involves tracking from the failing faulty output back through the topology of the board under test, measuring signatures at each node (and additional information if the node being measured is within a loop, as explained subsequently) until a component is found which has all good inputs and a bad output.

In order to avoid erroneous rejections of boards under test due to inconsistent probing or intermittent contact between the probe and the nodes being probed, each signature analysis test comparison is performed three times while the operator holds the probe on the subject node. If the three measured signatures are all faulty, but inconsistent, the algorithm produces information which causes the display to inform the operator that he is making a bad connection. He may then "retry", i.e. re-probe. If any correct signature is obtained on the node, the node response is assumed correct. The fault isolation algorithm then causes the PSP to instruct the operator to probe the next node in the topology of the board under test; the above-mentioned image file is referred to in order to determine which node to probe next.

If several signatures taken on one end of such a node conductor are consistent with each other, but are inconsistent with signatures on the other end of the same conductor, it is possible that the conductor is broken or that the operator is probing the wrong node. The fault isolation algorithm causes the PSP to instruct the operator to probe the opposite end of any node conductor if it is established that the signature at the first end of the node conductor is incorrect. If the signatures taken at the opposite end of the node conductor are inconsistent with those at the first end, the algorithm sends the operator back to the first end again to probe it. The algorithm causes the display to produce a "misprobed" readout only if the operator takes four inconsistent signatures, two at each end of the node conductor.

The signature analysis techniques described above "break down" if there is a feedback loop in the digital logic circuitry of the board under test. This is because an error in the response at any node in a digital feedback loop ordinarily propagates very quickly around the loop to produce faulty responses at every node in the loop, making ineffective the simple procedure of tracing along the topology pattern of a device under test until a device is found with a faulty output and all good input. As previously mentioned, all signature analysis techniques have been unsuccessful in isolating faults at nodes which occur within loops and digital circuits. Until the present invention, only expensive "factory testers" which store the entire data stream at every node, and which therefore require very large memory storage capability, have been able to isolate faults within feedback loops in digital circuits.

According to the present invention, a new procedure has been discovered which isolates faults within loops in digital circuits by determining and storing the initial state of each node in the loop and determining and storing the time at which each node in the loop initially failed. The inventive procedure has been found to compare such stored information for boards under test (with digital feedback loops therein) with data from known good boards of the same type to isolate (with a very surprisingly high degree of success) the defective components of the board under test.

The main features of the go-no-go and fault isolating algorithm of the PSP according to the invention are shown in the flow diagram of FIGS. 7A–7H. The algorithm of FIGS. 7A–7H first subjects the board under test to a go-no-go test, as previously described. This is accomplished by simultaneously comparing all of the output pins of the board under test to stored expected results for each of the pins of the board under test. If the board under test passes the test, the PSP display is caused to indicate that the board under test has passed. If the board under test fails, the PSP automatically goes into a portion of the algorithm, which polls all of the output pins of the board under test to determine which ones failed, and directs the operator to sequentially probe nodes which trace a path from the faulty output pin toward the input pins and perform a signature analysis at each probed node, until the fault is isolated, as previously explained. If any of the nodes of the board under test are involved in a digital loop, the algorithm first identifies the loop and then attempts to isolate a faulty node within the loop.

The algorithm of FIGS. 7A-7H operates in two different modes. The first one, referred to as the ASIG mode, assumes that the correct signature responses to the test program are all stored in the main memory. In the ASIG mode of operation, the output of the signature generator 180 (FIG. 5) is updated for each "test word" applied to the input pins of the board under test, until finally, at the end of the test, the output of the signature generator represents the signature for a particular output or node of the board under test. Only one output pin or internal node of the board under test at a time may be tested.

In the second mode of operation, referred to as the CSIG or "conditional" mode of operation, the test program supplies not only the desired stimulus states to the input pins of the board under test, but also supplies the expected single state response of each one of the output pins. The expected responses at the output pins are stored in the "expected result" or "high/low" latches of the pin control circuits or driver/sensor circuits, as previously described in relation to FIGS. 3B and 3C. The actual responses at the output pins of the board under test are then simultaneously compared with the contents of the corresponding high/low latches, and any fault results in a fault signal on one of the fault lines such as 94 of FIG. 3B and one of the group fault lines such as 59A of FIG. 3A.

In the flow chart of FIGS. 7A-7H, the test program consists of a number of statements between the "labels" SIG (signature) and ESIG (end signature). The "labels" in FIGS. 7A-7H may be regarded as points of entry into the algorithm). Each statement in the test program corresponds to a different configuration of the "exercising" or testing signals applied to the input pins of the board under test. Clearly, the test program must be carefully written to exercise the various pins and nodes which are desired to be tested, if the results of the signature analysis or the pin state testing are to be meaningful.

Figure 7A:
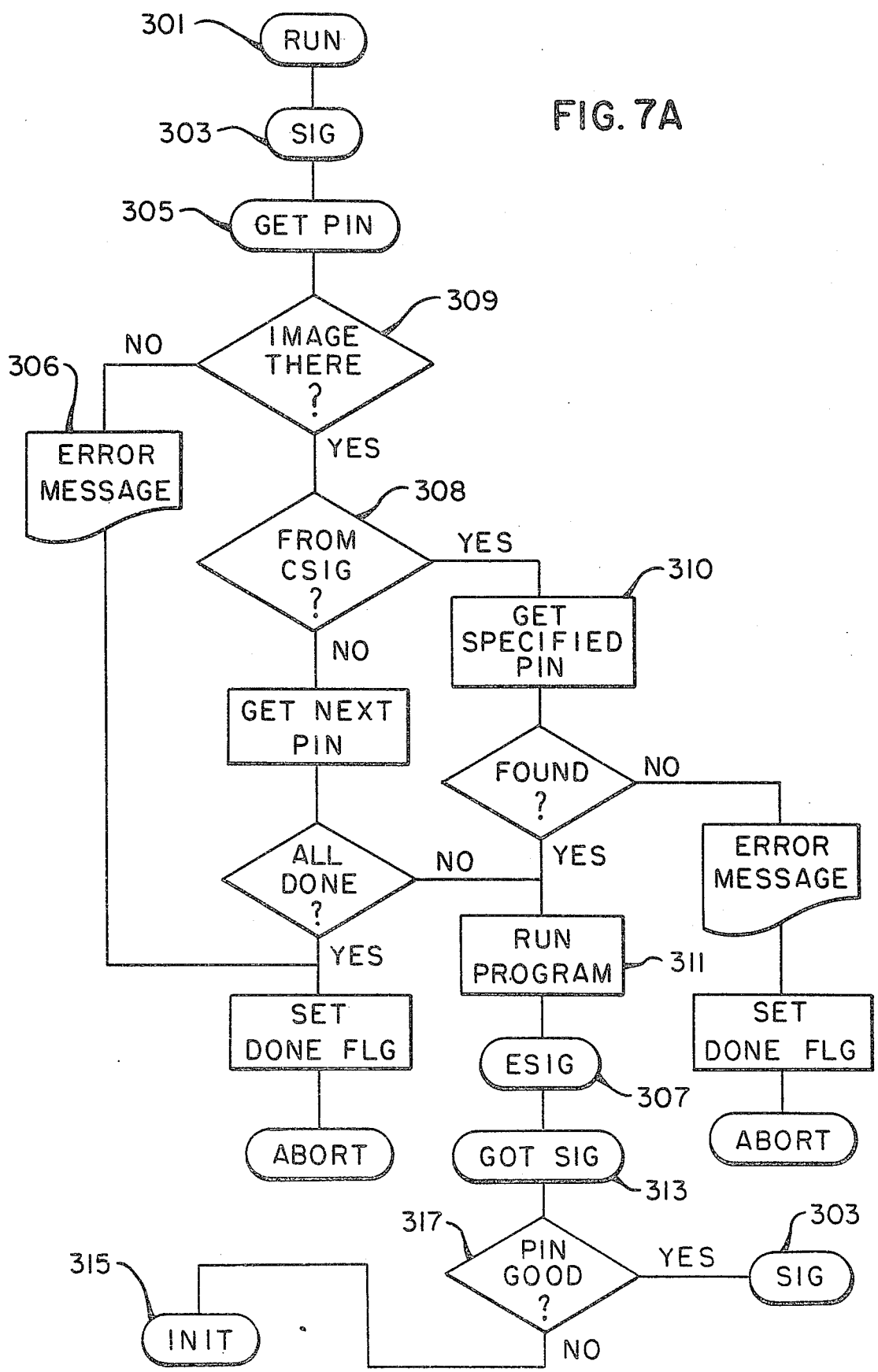
Figure 7C:
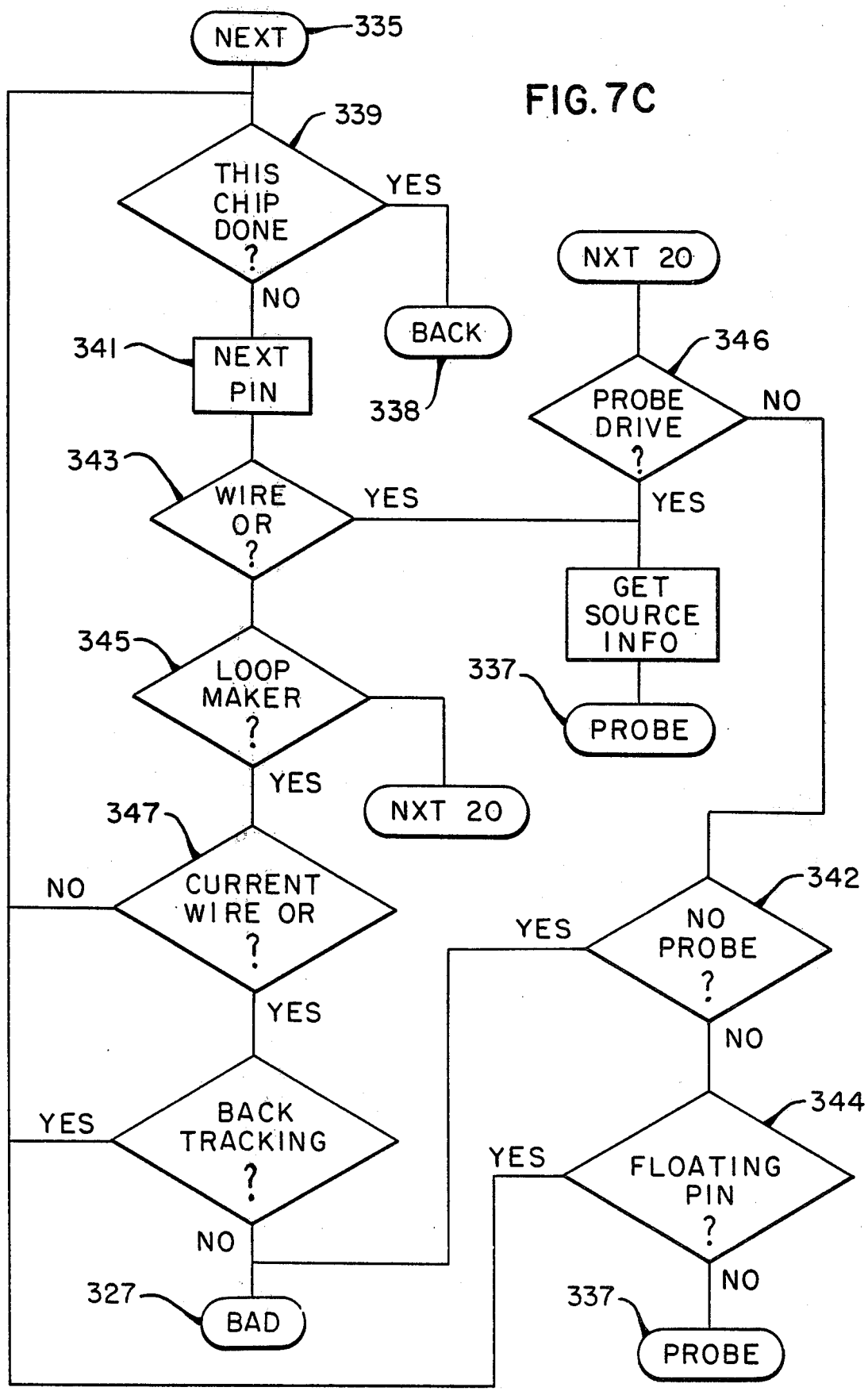

Referring now to FIG. 7A, after the operator types RUN, as indicated by reference numeral 301, into the keyboard, the test program is entered at label SIG, indicated by reference numeral 303. At this point, the SIG routine has to determine which output pin of the board under test is to be tested. This is accomplished by entry into the image file at the GETPIN label 305 each time the SIG statement 303 is executed. The number of the next output pin to be tested is put into a memory location called CURPIN, and the expected signature, retrieved from the image file, is put into a memory location called OUTPTR. A statement called ISIG clears the signature. A plurality of test words (i.e., X words), which are simply statements in the test program 311 corresponding to a configuration of inputs applied to the input pins of the board under test, are then executed, causing the signature to be produced by the signature generator. (This occurs only in the ASIG mode, when signature testing, as opposed to pin state testing, is in effect.) At the ESIG statement 307, the generated signature is compared to the known correct signature.

An error message 306 is printed if there is no image file in the main processor memory as indicated by decision block 309. If there is an image file in the main processor memory, the algorithm continues.

If the test program is started in the CSIG mode, as indicated by reference numeral 308 in FIG. 7A, and an output pin state failure is detected, the system software will put the pin number of a specific one of the failing pins in the location called CURPIN and −1 in a location called NXTPIN; this is accomplished by instructions in block 310 of FIG. 7A. The system software then sets a flag called ASIG and enters the program at SIG statement 303. The test program 311 is then run from SIG statement 303 to ESIG statement 307. Thus, from SIG statement 303, the fault isolation algorithm runs the test program for the pin specified in CURPIN.

If the initial program is in the CSIG mode, the test program compares all of the output pins from the board under test with their expected result every time an X statement is executed as the test program is run between SIG and ESIG. Upon reentering the algorithm at GOTSIG, as indicated by reference numeral 313 in FIG. 7A, various system flags and local flags are queried to determine which portion of the algorithm is to be executed next. If a flag called PRBFLG is set, the PSP is in the fault isolation, learn, or verify mode. The fault isolation mode is entered from the signature testing mode if an output pin of the board under test is not the same as its expected signature or state, as determined by decision block 317. When this signature occurs, the algorithm is entered at the INIT statement 315 (at the bottom of FIG. 7A), indicating that the output pin failed in test. If the output pin passed the test, the algorithm returns to SIG statement 303 to test the next output pin, which is found by the GETPIN portion of the algorithm, as previously.

If the output pin fails in test, the pass light of display 16 remains off and the fail light is turned on; as indicated by reference numeral 316 in FIG. 7B, the signature and a pin identifier are printed by the printer unless the NRP (no print) light of the display 16 is on. At this point, the go-no-go testing of the board under test is complete.

Once a faulty output pin of the board under test is identified by the polling routine, the image file, which contains information regarding all of the nodes, elements and connections therebetween for the board under test, is referred to to obtain the identification of all nodes which can affect the faulty output pin. (As subsequently explained, the algorithm tests each of the input nodes of the element which "drives" the faulty output in by instructing the operator to probe each such node and by performing a signature analysis of the response of each such node to the applied signal test pattern during such probing. If all such input nodes of the subject element are good, this indicates that the probable fault is that the subject element is defective. If one of the inputs is bad, the algorithm then refers to the image file, and identifies a second element driving that bad input, and proceeds to check all of the input nodes of such second element in the same fashion as for the first element. This process is continued until all element is found with a bad output and all good inputs).

The first time that a bad output pin is located on the board under test, the algorithm is entered at INIT statement 315, which then clears all of the pointers and node information in the history table, described hereinafter, and clears all of the counters in the image file to initialize the software for a fresh pass through the fault isolation portions of the algorithm.

The INIT (initialize) portion of the algorithm is shown in FIG. 7B. The test program control flags are then queried at label INIT1, designated by reference numeral 319. If the continue on fail (COF) mode is active, as determined in decision block 321, control is turned back to the test program to test next output pin of the board under test. If the restart on fail (ROF) mode is active, as determined in decision block 323, the done flag (DONFLG) is set and the algorithm returns to RUN label 301. Otherwise, the algorithm enters into its fault isolation section, and sets the probe flag PRBFLG, as indicated by block 325. The algorithm enters into a subroutine at BAD, shown in FIG. 7B by reference numeral 327.

The function of the algorithm subroutine beginning at BAD statement 327 is to maintain a "history table" (i.e., a reserved portion of the main memory on memory board 30) of the sequence of bad nodes found during any given probing sequence. The BAD algorithm determines whether the node being probed has been probed before, as indicated by decision block 329. If not, information representative of the input test number at which that node failed is added to the history table by a subroutine represented by block 331. The history table is in the form of a sequence of "initial failure numbers", each equal to the earlier of (1) the input test number of the initial transition of the response of a node, and (2) the input test number of the first transition of the known correct response of that node. Once the pointer corresponding to the node having the lowest initial failure number is known, other information about that node may be retrieved from the image file. The history table also contains a pointer to the location in the image file wherein information concerning that node is stored.

According to the invention, for a node which is determined to be bad on the basis of a comparison between the signature of that node measured during probing and the known correct signature from that node stored in the signature file, the information entered by the algorithm into the history table is the test number of the initial transition of the node being probed *or* the test number of the known correct initial transition of that node, stored in the signature file, whichever of these two test numbers is *smaller* (i.e., earlier). This smallest test number represents the time at which the probed node failed, as closely as can be determined from the available information; it is therefore this "earliest erroneous initial transition number" which is entered in the history table adjacent a pointer which points to that node in the image file.

An "input test number" (also referred to herein simply as a "test number") is a number which is incremented for each successive test word applied to an input of the board under test by the PSP. Thus, the input test number is used as an indicator of the relative times at which various events occur in the PSP. The history table thus contains a chronological sequence of the bad nodes found by probing; it contains information obtained by comparing the response taken from the node during probing with the known good response for that node fetched from the signature file.

Preliminary identification of a loop occurs as follows. Every time information concerning a new bad mode is entered into the history table (in block 331 of FIG. 7B), a "mark" is inserted into a "mark bit" in that location of the history table. If the algorithm finds that it has already been at the logical element connected to the node being probed, the algorithm scans the history table and "clears" all succeeding marks for those entrys having marks by means of a subroutine represented by block 333. The "suspected" loop, or "unresolved" loop, then consists of the last marked node and all of the subsequent unmarked (i.e., cleared) nodes in the history table.

Figure 7D:
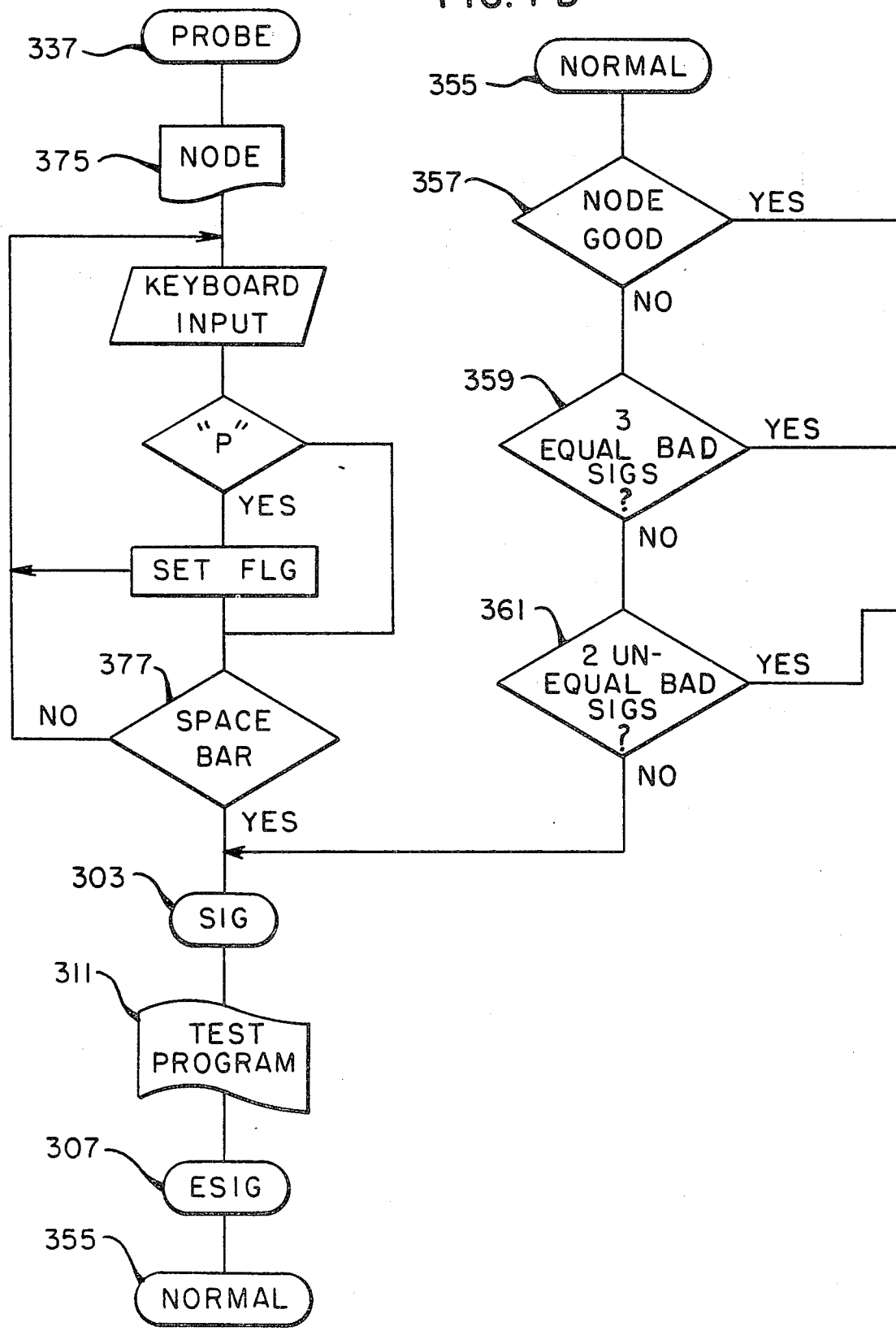
Figure 7E:
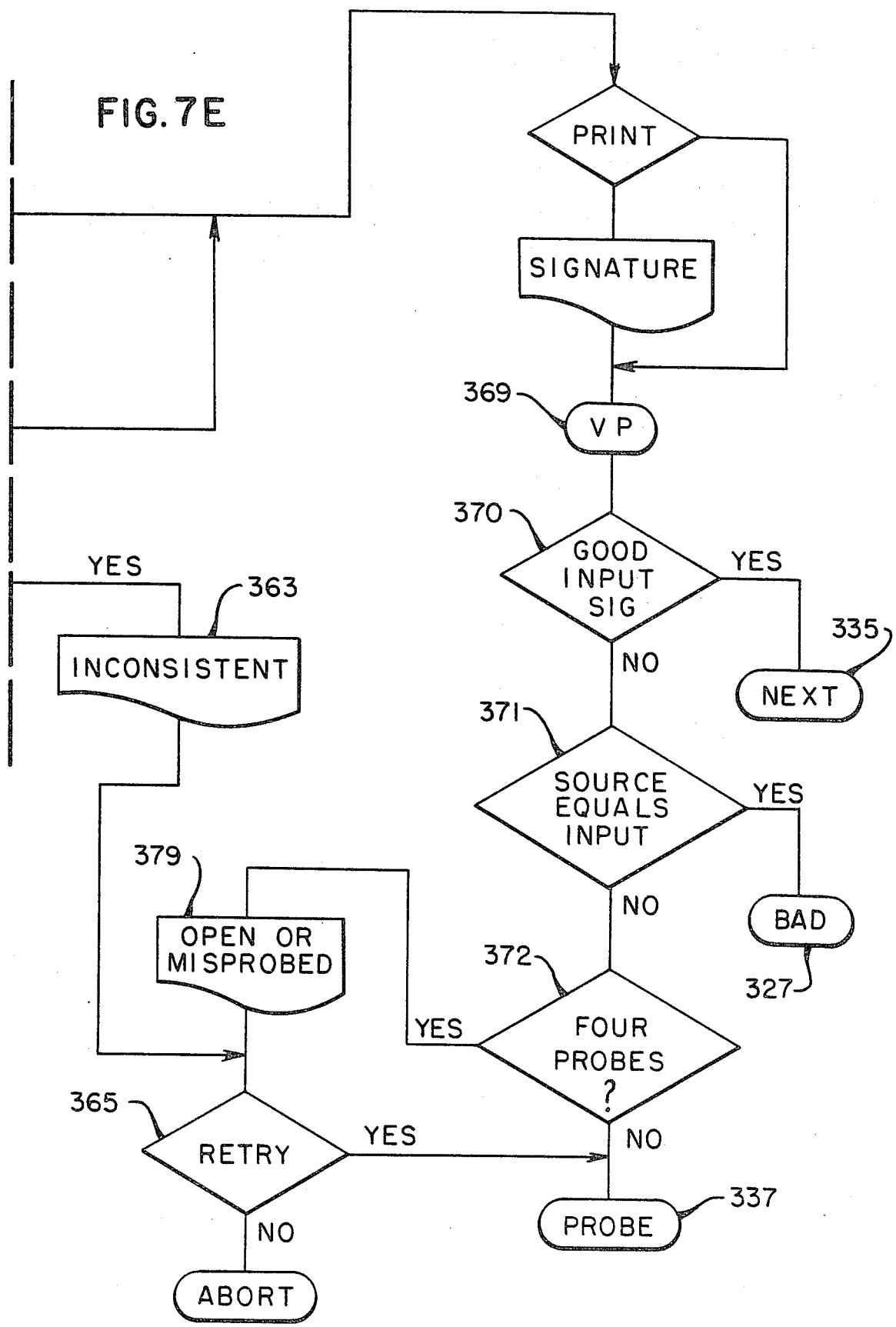
Figure 7F:
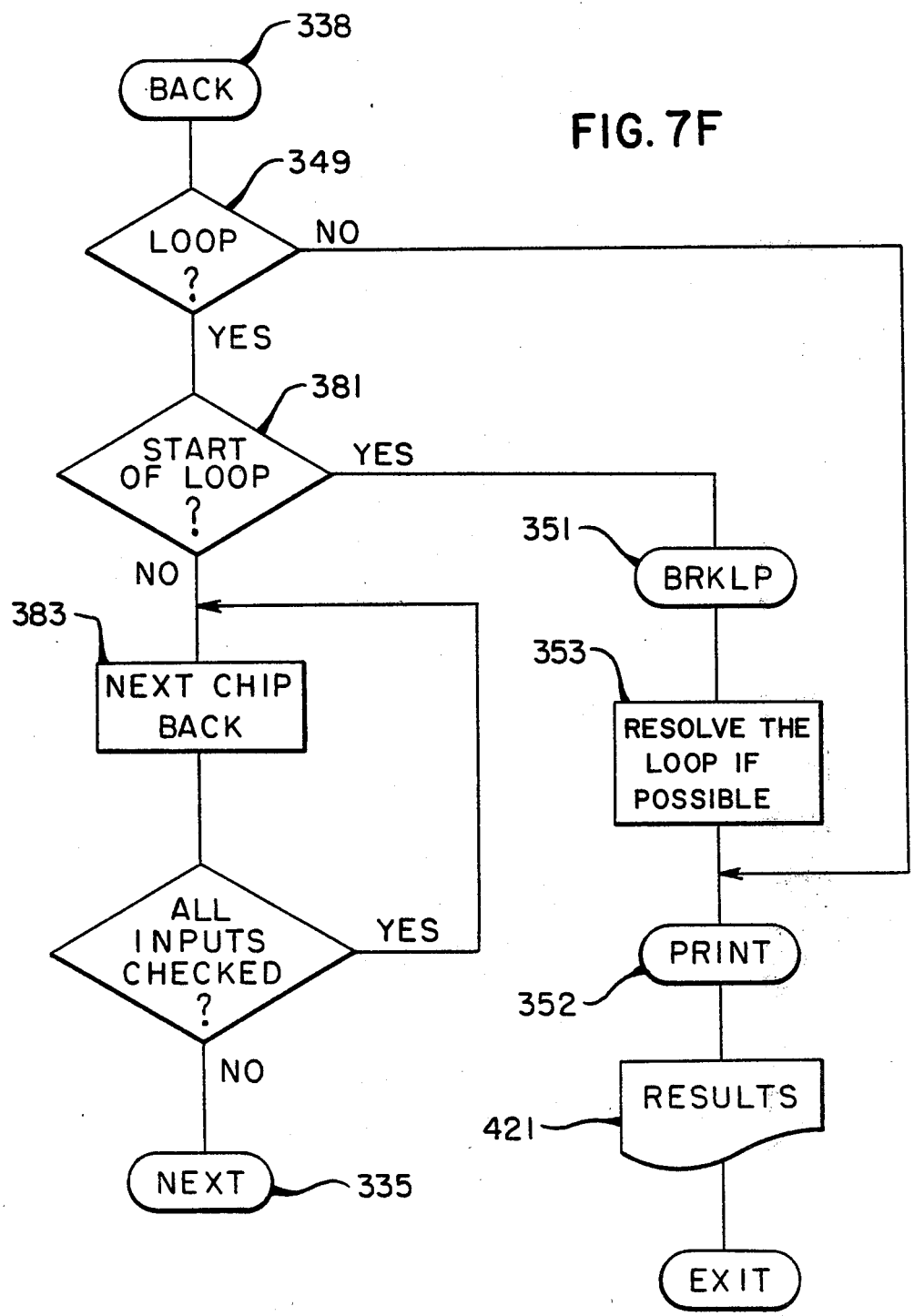

Once a suspected but unresolved loop is identified in this manner, the algorithm goes to the BACK subroutine (reference numeral 338) of FIG. 7F to check all of the remaining inputs (referred to as "loop entry nodes" of the subject loop) of all elements in the unresolved loop in order to test all other possible inputs to the unresolved loop to determine if the bad nodes detected in the unresolved loop could have been produced by such other inputs.

Thus, the code after the label BAD (reference numeral 327) adds nodes to the history table or marks the loop boundaries by clearing the mark bits of previous entries to the history table. From either of these branches, the BAD subroutine goes to the location NEXT (reference numeral 335), which is the entry point to a portion of the algorithm shown in FIG. 7C. The NEXT portion of the algorithm determines which node is to be probed next by the operator. The algorithm first checks (at decision block 339) to see if there are any more inputs to the element connected to the previous node probed. If so, the algorithm goes to the above-mentioned BACK statement indicated by reference numeral 338 in FIGS. 7C and 7F. If all inputs of that element are not probed, the algorithm then goes to the next input node of that element, as indicated by block 341. (It should be remembered that there are various flags and counters in the image file which are updated during execution of the NEXT subroutine. Consequently, the image file "knows" which node is to be probed next for that element.)

The procedure implemented by the NEXT subroutine is to follow bad nodes back along a circuit path toward the inputs of the board under test until a logical element is found with all good inputs and a bad output, or until an unresolved loop is detected. (The probe drive, no probe, floating pin, and wire OR conditions, indicated by decision blocks 346, 342, 344, and 343, are handled in the NEXT subroutine, but discussion of them is omitted because it is unimportant to the invention. For "no probe" nodes, the algorithm goes to the BAD subroutine.)

Every time all of the inputs to a logical element have been probed and tested by the NEXT subroutine, the algorithm goes to the BACK portion of the algorithm (shown in FIG. 7F) in response to decision block 339. In other words, any time the algorithm goes to the NEXT subroutine of FIG. 7C and finds that all of the inputs of the logical element currently being probed have been checked, the algorithm them jumps to the BACK subroutine of FIG. 7F.

The purpose of the BACK subroutine 388 is to find any other inputs (i.e., any other loop entry nodes) to any logical element in the identified loop which have incorrect signatures and which are not fed back from any other point in the same loop. In other words, the algorithm "backtracks" from the point at which an identified loop is identified as such, trying to find an "escape" route (i.e., an input to the loop, which input is not fed back from another node within the loop) which could be the source of the errors detected at the various nodes within the identified loop.

If there is a loop, decision block 349 of FIG. 7F causes the code at location BACK to utilize the history table to "backtrack" through all logical elements in the loop until all inputs in the loop are found to have correct responses or until an escape route, i.e., a bad input, is found. Any bad input (i.e., any loop entry node having an incorrect response) not driven from within the loop "breaks" the loop and starts a new probing path toward the signal sources, i.e., the test inputs applied by the PSP to the board under test.

If no loop is detected at decision block 349 of FIG. 7F upon entering the subroutine BACK, the last node in the history table corresponds to the node which is the source of the fault and the location PRINT (reference numeral 352) is then called and the PSP prints out the name of the component corresponding to the last node in the history table as the probable fault.

In the process of backtracking, the subroutine BACK starts at the "bottom" of the history table (i.e., the first entry therein) and checks out all of the inputs of the last logical element involved, and works toward the "top" or "starting point" of the loop, as indicated by blocks 381 and 383 of FIG. 7F. If it gets to the marked logical element at the top of the loop and finds that all of its inputs are good (see block 339 of FIG. 7C), it has established that the error causing the incorrect signature within the loop is indeed caused within the loop, rather than from somewhere outside the loop. The loops are always checked from the bottom up to top during backtracking; previous "marks" are cleared for each entry, up to the entry corresponding to the first mark. If, during the execution of the BACK routine, an input to the loop is found to be bad, which input does not emanate from another point in the loop, that node and its corresponding signature comparison information are entered as a new entry in the history table, in the BAD subroutine of FIG. 7B. The algorithm would direct probing from the later node on toward the test pattern inputs to the board under test until an input is reached, or another component with a bad output and all good inputs is found, or another suspected loop is identified.

However, if the bad input is connected to another point in the loop, no entry for that bad input is entered into the history table.

Assume that the algorithm goes to the BACK subroutine and then determines that there is *not* an escape route from an unresolved loop. That means that all of the input pins to the unresolved loop have been checked and have been found to be good. Therefore, the nodes found faulty in the loop cannot have been caused by any loop entry outside inputs to the loop. Therefore, there are no escape routes from the loop, and the error has to be in the loop; the loop must now be "resolved" in order to isolate the defective component of condition within the loop causing the faulty signatures at the nodes in the loop. The algorithm then goes to the location BRKLP (break loop) indicated in FIG. 7F by reference numeral 351.

The code at location BRKLP uses the information derived from the expected signatures (i.e., the input test number at which each node failed) stored in the history table to determine which node was a source of the problem.

The way in which the information in the history table is utilized by the BRKLP portion of the algorithm (indicated by reference numeral 353 in FIG. 7F) is as follows: the algorithm "walks" through the history table from the entry corresponding to the first-probed node of the loop to the bottom of the loop. The history table is a chronological record of the sequence in which the incorrect signatures were found during the probing sequence. Each bad entry in the history table contains the above mentioned "earliest erroneous initial transition number" and the "pointer" of the corresponding node. The algorithm compares each previously stored input test number (at which each node failed) with the next stored input test number and "remembers" the smaller (i.e., earlier) of the two and compares it with the next stored input test number in the history table, so that by the time the bottom of the loop is reached, only the smallest (earliest) input test number in the history table is "remembered". The algorithm "remembers" such successively smaller input test numbers by means of an "input test number variable" of the BRKLP subroutine. Each time the BRKLP subroutine "encounters" another input test number stored in the history table during the above mentioned "walking" through the history table, the input test number variable is set to equal the value of the encountered input test number if the encountered input test number is smaller than or equal to the present value of the input test number variable. The node corresponding to that earliest test number is assumed to be the node which is defective, and the element driving that node is assumed to be the defective logical element, and its identifier is printed out as the probable fault.

Block 353 of FIG. 7F is shown in detail in FIGS. 7G and 7H, wherein the subroutine represented by block 353 in FIG. 7F is entered at BRKLP statement 351. Beginning at the entry of the history table corresponding to the first-probed node of the loop, the algorithm sets the present value of an input test number variable to the maximum permissible value, as indicated in block 401. (The maximum permissible value of the input test number variable is the maximum permissible number [i.e., all "ones"] which can be stored in the above mentioned PSP memory location in which the input test number is stored.) The algorithm then begins "walking" through the history table, as explained above. The algorithm compares the present value (of the input test number variable) to the value of the input test number stored in the first location of the history table and determines whether the input test number stored in the first location of the history table is equal to or less than the present (i.e., highest permissible) value of the input test number variable, as indicated in decision block 403. If the value stored in the present (i.e., first) location of the history table is less than or equal to the present value of the input test number, the algorithm then sets the test number variable to that value stored in the present (first) location of the history table, as indicated by block 405. The algorithm then "remembers" the new value of the test number variable and the location of the history table wherein that value is stored as indicated in block 407. The algorithm then checks the next (second) entry in the history table, as indicated by block 409.

The algorithm then ascertains whether or not all entries in the history table have been checked, as indicated by decision block 411. If not, the algorithm reenters the flow chart of FIG. 7G at the input to decision block 403 and repeats the above steps. After all entries in the history table have been checked, the test number variable will be set at the lowest and latest input test number stored in any location of the history table, and the corresponding location of the history table will be "remembered". The algorithm then exits from decision block 411 to decision block 413 of FIG. 7H. In decision block 413 the algorithm determines whether the present value of the test number variable is equal to the highest possible number, and if it is, the algorithm concludes that the loop is unbreakable, as indicated in block 417. If the present value of the test number variable is not equal to the highest possible value, the algorithm determines whether the test number variable is equal to all input test numbers of the loop stored in the history table, as indicated by decision block 415, to determine whether the loop is an asynchronous loop; if the test number variable is equal to all of the input test numbers of the loop stored in the history table, the loop is asynchronous. If the loop is asynchronous, the algorithm again concludes that the loop is unbreakable, as indicated by block 417. If the loop is not asynchronous, the final "remembered" location of the history table, wherein the lowest value of the input test number variable was found, points to the faulty node of the loop. At this point, the loop is resolved, and the results are printed, as indicated in statement 351 and block 421.

The chronological probing history stored in the history table is not printed out if the loop can be "broken". However, if the data is insufficient to determine the cause of the incorrect signatures, or if the loop is asynchronous (i.e., all the nodes in the loop fail at the same time because there are no delay elements in the loop), then all of the nodes in the loop are printed out as the probable fault.

As mentioned above, the loop breaking algorithm is incapable of isolating a fault in an asynchronous loop. In order to determine whether a loop is asynchronous, a portion 415 of the loop-breaking algorithm makes a pass through the loop to determine if there is any delay element therein. If there is no delay element, the algorithm makes no attempt to break the loop.

If PRBFLG is set, the algorithm is entered at the label NORMAL (indicated by reference numeral 355 in FIG. 7D) every time the ESIG statement 307 in FIG. 7A is executed. This is the portion of the algorithm that insures consistent probing and identifies misprobing.

Referring now to FIG. 7D, the code at the label NORMAL (reference numeral 355) insures consistent signatures by rerunning the test program until a good signature is found, (as indicated by decision block 357), or until two different unequal bad signatures are found (as indicated by decision block 361), or until three equal bad signatures are taken, as indicated by decision block 359. If two different bad signatures are found, the word "INCONSISTENT" is printed (as indicated by block 363 of FIG. 7E) and the word "RETRY" is displayed. At this time, the operator can re-run the test, as indicated in decision block 365 (by typing "Y") or abort (by typing "N"). (If a "P" has been typed after any probing instruction, the signatures are printed for either good or bad nodes).

Referring to FIG. 7D, at the label PROBE (indicated by reference numeral 337) the algorithm prints and displays the next node to be probed, (as indicated by reference numeral 375) waits for the space bar to be depressed by the operator, (as indicated by reference numeral 377) and then returns to the system software. The algorithm executes the test program from SIG (reference numeral 303) to ESIG (reference numeral 307), takes the signature from the probed node, and then vectors to the label NORMAL (reference numeral 355 in FIG. 7D).

A subroutine at the label VP (reference numeral 369 in FIG. 7E) verifies probing accuracy by insuring that any bad signature is found at two different locations on each bad node conductor before calling that node bad. These locations will ordinarily be at opposite ends of a conductor forming the node being probed. Failure to meet this requirement will result in display of a "RETRY" message, as indicated by decision blocks 370, 371, and 372. The operator may then retry or abort, as indicated by decision block 365 and the label ABORT. If the node is good, the algorithm goes to location NEXT, as indicated by decision block 370 and label BAD. If the node is bad, the algorithm goes to location BAD, as indicated by decision block 371 and label 327. If the algorithm gets the same bad signature at opposite ends of the conductor forming the node, or if there are a total of four attempts at probing, the algorithm calls the node bad, as indicated by reference numeral 372. However, anytime the algorithm gets a good result, it calls the node good. If signatures measured at different ends of the same node are both bad, but unequal, the algorithm takes additional signatures. If, at the other end of the node, the algorithm obtains two equal bad signatures, it prints out the message "OPEN OR MISPROBED", as indicated by reference numeral 379 in FIG. 7E.

The automatic fault isolation system and method, according to the invention, facilitate operator interaction with the system to permit the operator to trace down defective components without reference to a schematic drawing of the device under test.

These interactive features permit the operator to interact with the system during execution of a test program and to "troubleshoot" the board under test in somewhat the same manner as if the operator were troubleshooting the board under test in a laboratory utilizing various electronic equipment to provide test inputs to the board under test and test its performance on a node-by-node basis to isolate a particular fault.

The PSP also can print out a "load list" when operated in the automatic fault isolation mode. This permits the operator to further trace out circuit operation in case replacement of the component indicated as a probable fault does not result in fault free operation of the board under test. The load list indicates which nodes are driven by the specified node and the results obtained from the signature analysis performed by the software in response to the probing. The operator may then be able to repair the board under test without reference to extensive documentation, even though the automatic fault isolation routine fails to precisely indicate a fault. Normally, if the signature of a particular node is faulty, it may be assumed that the chip or component driving that node or component are determined to have correct signatures. However, under certain conditions, this assumption may be wrong. As mentioned above, there could be a short in the printed circuit board wiring, or the input of a subsequent component connected to the subject node could be defective, thereby causing the fault. Under these conditions, it is very convenient to have the printed "load list".

It should be noted that although the PSP is a portable tester for detecting and isolating faults on digital printed circuit boards and exercising certain analog functions, it is also a general purpose microprocessor-based data processing system and may be utilized for additional applications. Such applications include loading system software, saving customer totals in terminal products, recording "dumps" of EDP software to aid system debugging, programming of erasable read-only memories, testing communications equipment and circuits, and providing certain logic analyzer functions to aid microcomputer testing.

We claim:

1. A tester for testing printed circuit boards, said tester comprising in combination:
   (a) a processor;
   (b) a bus connected to said processor;
   (c) a plurality of programmable driver/sensor circuits each having a data input terminal and a terminal selectively programmable either as an input terminal for sensing a signal on said programmable terminal or as an output terminal responsive to a data signal applied to said data input terminal;
   (d) first means for coupling said programmable terminals to the respective terminals of a printed circuit board to be tested;
   (e) second means responsive to said processor for routing information from said bus to the data input terminals of said driver/sensor circuit; and
   (f) each of said driver/sensor circuits further comprising first and second termination means for producing pull-up and pull-down currents coupled to the programmable terminal of that driver/sensor circuit; and
   (g) mode control means for selecting said first or said second termination means for producing said pull-up or said pull-down current coupled to the programmable terminal of said driver/sensor circuit.

2. A tester for testing printed circuit boards, said tester comprising in combination:
   (a) a processor;
   (b) a bus connected to said processor;
   (c) a plurality of programmable driver/sensor circuits each having a data input terminal and a terminal selectively programmable either as an input terminal for sensing a signal on said programmable terminal or as an output terminal responsive to a data signal applied to said data input terminal;
   (d) first means for coupling said programmable terminals to the respective terminals of a printed circuit board to be tested;
   (e) second means responsive to said processor for routing information from said bus to the data input terminals of said driver/sensor circuit;
   (f) each of said driver/sensor circuits further comprising first termination means programmable for producing a pull-up current flowing into the programmable terminal of that driver/sensor circuit, whereby pull-up termination devices may be omitted from said printed circuit boards;
   (g) each of said driver/sensor circuits further comprising second termination means programmable for producing a pull-down current flowing out of the programmable terminal of that driver/sensor circuit, whereby pull-down termination devices may be omitted from said printed circuit boards;
   (h) wherein said first and second termination means include first and second current sources, respectively, for producing said pull-up and pull-down currents, respectively;
   (i) wherein each of said driver/sensor circuits includes a plurality of mode control inputs and mode control means responsive to said mode control inputs for controlling the programmable functions of said driver/sensor circuits; and
   (j) wherein each of said driver/sensor circuits further includes sensing circuit means responsive to said programmable terminal and said mode control means for sensing a signal applied to said programmable terminal and turning off said pull-up current and said pull-down current when said mode control inputs are in a first configuration.

3. The tester of claim 2 wherein said sensing circuit means detect a signal on said programmable terminal and said mode control means turns on said pull-up current and turns off said pull-down current when said mode control inputs are in a second configuration.

4. The tester of claim 3 wherein said sensing circuit means senses a signal on said programmable terminal and said mode control means turns off said pull-up current and turns on said pull-down current when said mode control inputs are in a third configuration.

5. The tester of claim 4 wherein said tester further includes driver circuit means responsive to said mode control means and said data input terminal when said mode control inputs are in a fourth configuration.

6. A programmable driver/sensor circuit suitable for use in a processor-oriented tester, said driver/sensor circuit comprising in combination:
   (a) a data input terminal and a terminal selectively programmable either as an input terminal for sensing a signal on said programmable terminal or as an output terminal responsive to a data signal applied to said data input terminal;
   (b) first and second termination means for producing pull-up and pull-down currents coupled to the programmable terminal of that driver/sensor circuit; and
   (c) mode control means for selecting said first or said second termination means for producing said pull-up or said pull-down current coupled to the programmable terminal of said driver/sensor circuit.

* * * * *